(12) United States Patent
Jacobs et al.

(10) Patent No.: US 10,074,505 B2
(45) Date of Patent: Sep. 11, 2018

(54) PEROVSKITES AS ULTRA-LOW WORK FUNCTION ELECTRON EMISSION MATERIALS

(71) Applicant: Wisconsin Alumni Research Foundation, Madison, WI (US)

(72) Inventors: Ryan Matthew Jacobs, Madison, WI (US); Dane Morgan, Middleton, WI (US); John Booske, McFarland, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 15/372,726

(22) Filed: Dec. 8, 2016

(65) Prior Publication Data

US 2017/0207055 A1     Jul. 20, 2017

Related U.S. Application Data

(60) Provisional application No. 62/278,813, filed on Jan. 14, 2016.

(51) Int. Cl.
  *H01J 45/00*    (2006.01)
  *H01J 19/062*   (2006.01)
  (Continued)

(52) U.S. Cl.
  CPC .......... *H01J 19/062* (2013.01); *H01J 19/064* (2013.01); *H01J 23/04* (2013.01); *H01J 25/42* (2013.01);
  (Continued)

(58) Field of Classification Search
  None
  See application file for complete search history.

(56) References Cited

U.S. PATENT DOCUMENTS

| 4,810,926 A | * | 3/1989 | Schwarz | H01J 1/28 |
| | | | | 252/515 |
| 5,089,742 A | * | 2/1992 | Kirkpatrick | H01J 1/3042 |
| | | | | 313/351 |

(Continued)

OTHER PUBLICATIONS

J.A Moyer "Highly conductive SrVO3 as a bottom electrode for functional perovskite oxides" Advanced Materials 2013, 25, 3578-3582.*

(Continued)

*Primary Examiner* — Douglas W Owens
*Assistant Examiner* — Srinivas Sathiraju
(74) *Attorney, Agent, or Firm* — Bell & Manning, LLC

(57) ABSTRACT

An electron emitter device is provided comprising a cathode comprising a conductive transition metal perovskite oxide comprising mobile conducting electrons exhibiting a conductivity of at least $10^{-6}$ $\Omega^{-1}$-$cm^{-1}$ at room temperature, the transition metal perovskite oxide having a surface from which the mobile electrons are induced to emit upon receiving sufficient energy from an energy source; and an anode electrically coupled to the cathode and positioned to define an interelectrode conductive region between the anode and the cathode, onto which anode the emitted electrons are collected. The transition metal perovskite oxide may have formula $Sr_{1-x}Ba_xVO_3$. Related methods and devices based on the electron emitter device are also provided.

19 Claims, 10 Drawing Sheets

(51) Int. Cl.
  *H01J 19/064* (2006.01)
  *H01J 25/42* (2006.01)
  *H01J 23/04* (2006.01)
  *H03F 3/58* (2006.01)
  *H03F 3/189* (2006.01)
(52) U.S. Cl.
  CPC .............. *H01J 45/00* (2013.01); *H03F 3/189* (2013.01); *H03F 3/58* (2013.01); *H03F 2200/451* (2013.01)

(56) References Cited

U.S. PATENT DOCUMENTS

| | | | | |
|---|---|---|---|---|
| 5,552,661 | A * | 9/1996 | Lee | H01J 1/26 313/337 |
| 5,666,022 | A * | 9/1997 | Deckers | H01J 1/28 313/346 DC |
| 5,828,165 | A * | 10/1998 | Clerc | H01J 1/14 313/346 DC |
| 5,890,941 | A * | 4/1999 | Deckers | H01J 1/28 445/51 |
| 6,855,992 | B2 * | 2/2005 | Emrick | H01L 27/0605 257/16 |
| 6,885,065 | B2 * | 4/2005 | Liang | B82Y 10/00 257/347 |
| 7,020,374 | B2 * | 3/2006 | Talin | G02B 6/132 385/131 |
| 7,048,785 | B2 * | 5/2006 | Wang | F17C 11/00 502/439 |
| 7,393,699 | B2 * | 7/2008 | Tran | B82Y 10/00 438/1 |
| 7,545,089 | B1 * | 6/2009 | Falce | H01J 35/06 313/336 |
| 2005/0019594 | A1 * | 1/2005 | Hunt | B01D 53/228 428/469 |
| 2007/0285843 | A1 * | 12/2007 | Tran | B82Y 10/00 360/245.9 |
| 2011/0111943 | A1 * | 5/2011 | Zhang | C04B 35/4682 501/32 |
| 2014/0060643 | A1 * | 3/2014 | Martin | B01J 37/349 136/256 |
| 2016/0307704 | A1 * | 10/2016 | Hillhouse | H01L 31/022441 |
| 2017/0207055 | A1 * | 7/2017 | Jacobs | H01J 19/062 |

OTHER PUBLICATIONS

Hong et al., Probing LaMO$_3$ Metal and Oxygen Partial Density of States Using X.ray Emission, Absorption, and Photoelectron Spectroscopy, J. Phys. Chem. C 2015, 119,, Jan. 8, 2015, pp. 2063-2072.

Jacobs et al., Strontium vanadate: An ultra-low work function electron emission material, IVEC 2015: Session 10—Thermionic cathodes—Fundamental, Apr. 28, 2015.

Chen et al., Si field emitter arrays coated with thin ferroelectric films, Ceram. Int., doi:10.1016/j.ceramint.2007.09.084, 2007.

R. Jacobs, Density Functional Theory-based Modeling of Cathode Materials for Electronic and Electrochemical Systems, The University of Wisconsin—Madison, Oct. 1, 2015, 328 pages; Publication No. 3722663.

* cited by examiner

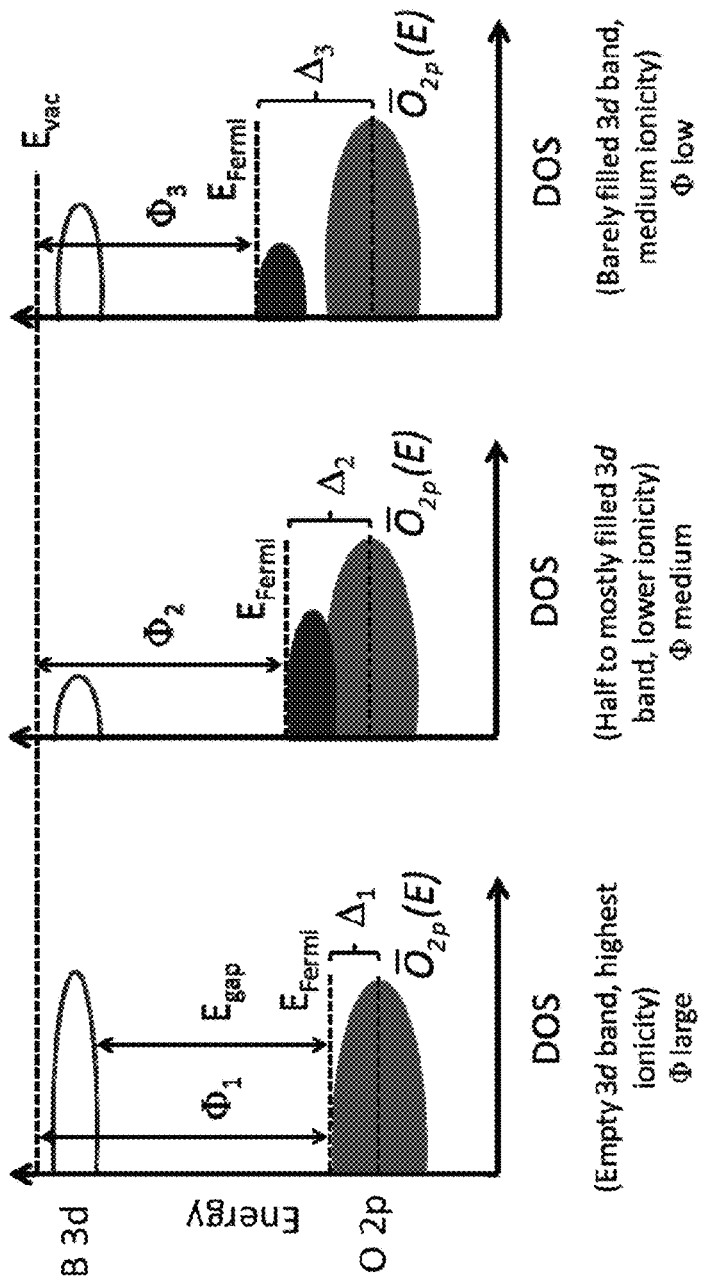

PEROVSKITES AS ULTRA-LOW WORK FUNCTION ELECTRON EMISSION MATERIALS

CROSS-REFERENCE TO RELATED APPLICATIONS

The present application claims priority to U.S. Provisional Patent Application No. 62/278,813 that was filed Jan. 14, 2016, the entire content of which is hereby incorporated by reference.

REFERENCE TO GOVERNMENT RIGHTS

This invention was made with government support under FA9550-11-1-0299 awarded by the USAF/AFOSR. The government has certain rights in the invention.

BACKGROUND

Thermionic electron emitters are typically comprised of a refractory metal such as W coated with an oxide or diffusing oxide species that lowers the work function via electrostatic surface dipoles. The coating is necessary because although the refractory metals are stable and good conductors of electrons, they tend to have high work functions (on the order of 4.5 eV), and are therefore natively poor electron emitters unless a coating is included to lower their work function. Examples of thermionic emitters include impregnated W cathodes that have a low work function due to the formation of Ba—O dipoles[1] and scandate cathodes where a complex interplay between dipole formation and electron doping of Ba—O on $Sc_2O_3$ has been proposed to create a low work function.[1-3] These types of thermionic emitters have been employed in many high power electron beam applications[4, 5], and even thermionic energy conversion emitting layers rely on the same type of volatile surface dipole layers, such as Cs—O adsorbed on GaAs or InGaAs. [6, 7] However, these emission materials contain volatile surface species, which limits the lifetime and the efficiency of electronic devices which use thermionic electron emission processes.

SUMMARY

Provided herein are electron emitter devices which comprise transition metal perovskite oxides and related methods.

In one aspect, an electron emitter device is provided. In embodiments, an electron emitter device comprises a cathode comprising a conductive transition metal perovskite oxide comprising mobile conducting electrons exhibiting a conductivity of at least $10^{-6}$ $\Omega^{-1}$-$cm^{-1}$ at room temperature, the transition metal perovskite oxide having a surface from which the mobile electrons are induced to emit upon receiving sufficient energy from an energy source; and an anode electrically coupled to the cathode and positioned to define an interelectrode conductive region between the anode and the cathode, onto which anode the emitted electrons are collected. The transition metal perovskite oxide does not have the formula $(La,Ba,Sr)TiO_3$.

In another aspect, a source of microwaves or millimeter waves is provided, the source comprising the illustrative electron emitter device.

In another aspect, a thermionic energy converter is provided, the converter comprising the illustrative electron emitter device.

In another aspect, a method of generating electrons is provided. The method comprises applying energy to the cathode of the illustrative electron emitter device, wherein the applied energy is sufficient to induce the emission of the mobile electrons from the surface of the transition metal perovskite oxide into the interelectrode conductive region, and collecting the emitted electrons on the anode.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 3A-3C show schematic density of states plots for (FIG. 3A) insulating perovskite with empty 3d band such as $LaScO_3$, (FIG. 3B) perovskite with partially or mostly filled 3d band such as $LaNiO_3$, and (FIG. 3C) metallic perovskite with minimally filled 3d band such as $SrVO_3$. The red regions denote O 2p states while the blue regions denote B 3d states. Shaded regions indicate filled states while unshaded regions denote empty states. The labels and symbols are defined in the main text. The case in plot (FIG. 3C) of a material with minimally filled 3d band results in an O 2p-band center furthest below $E_{Fermi}$ and a low work function. The $\Delta$ values are defined as the difference between the O 2p-band center and $E_{Fermi}$, equivalent to the x-axis of FIG. 4A-4B.

In FIG. 4A there is a semi-quantitative linear correlation of $BO_2$ work function with the bulk O 2p-band center. In FIG. 4B there is a semi-quantitative linear correlation for AO work function with the bulk O 2p-band center.

FIG. 5A shows the (011) orientation, whereby the top surface is O-terminated and the bottom surface is ABO-terminated. FIG. 5B shows the (111) orientation, with both surfaces terminated as $AO_3$. FIG. 5C shows the (111) orientation, now with both surfaces B-terminated.

The large spheres are Sr, medium-sized spheres are V (in the middle of the octahedra), and the small spheres are O.

Figure 6C:
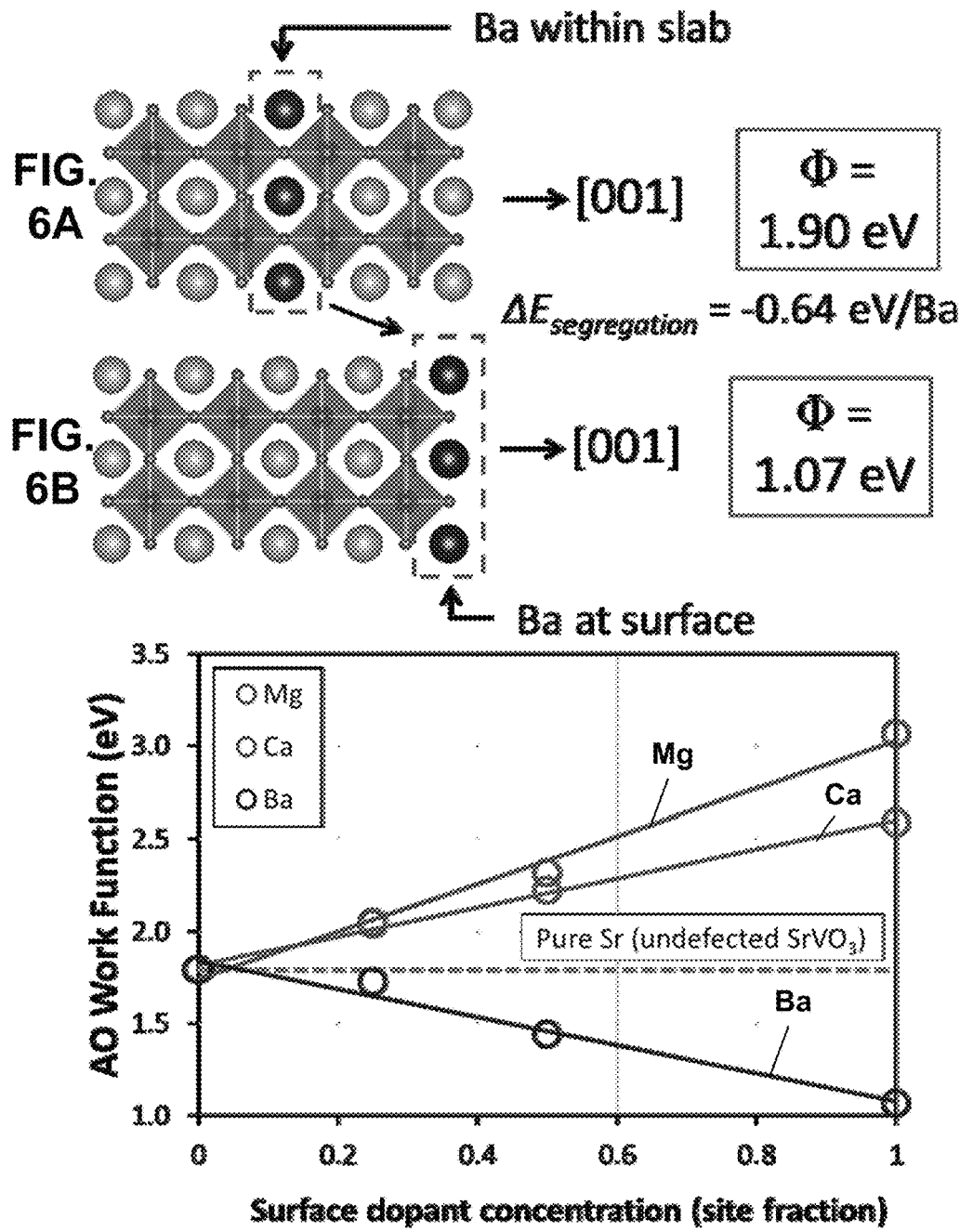

FIGS. 6A-6C present the results of simulated AO-terminated (001) $SrVO_3$ surfaces with the top SrO layer replaced by varying amounts of A'O (A'=Mg, Ca, Ba) alloying species (A' doped) with FIG. 6A-6B illustrating the case for BaO doping. FIG. 6A shows Ba doping in the middle of the surface slab, resulting in a work function of 1.90 eV. FIG. 6B shows Ba doping at the surface of the slab, resulting in an extremely low work function of 1.07 eV. The Ba segregation energy was calculated to be −0.64 eV/Ba, and indicates that Ba will preferentially segregate to the surface. The large light spheres are Sr, the large dark spheres are Ba, medium-sized spheres are V (in the middle of the octahedra), and the small spheres are O. The plot in FIG. 6C shows how the calculated AO-terminated $SrVO_3$ work function changes when the top surface layer is alloyed with Mg, Ca, and Ba for different concentrations. The only dopant expected to lower the work function is Ba.

Figure 7:
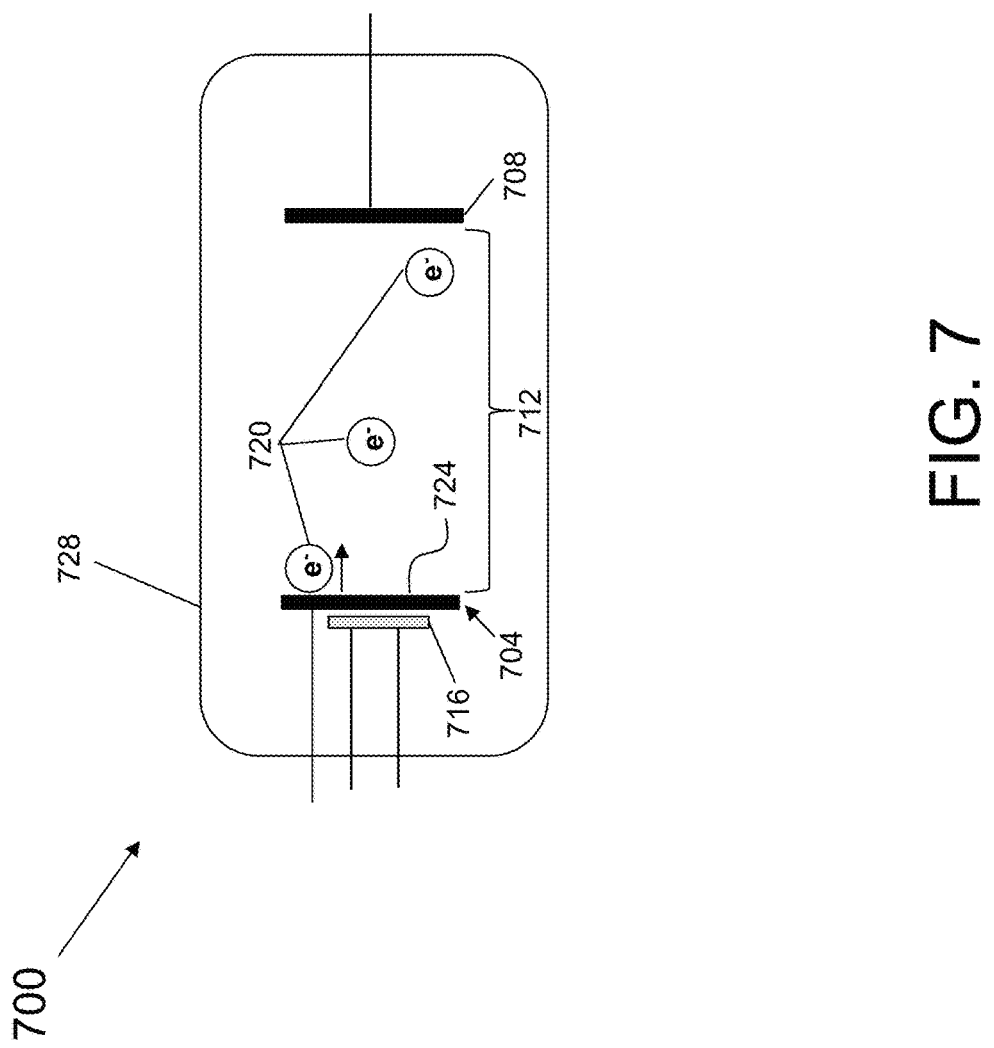

FIG. 7 is a schematic illustration of an electron emitter device according to an illustrative embodiment.

Figure 8:
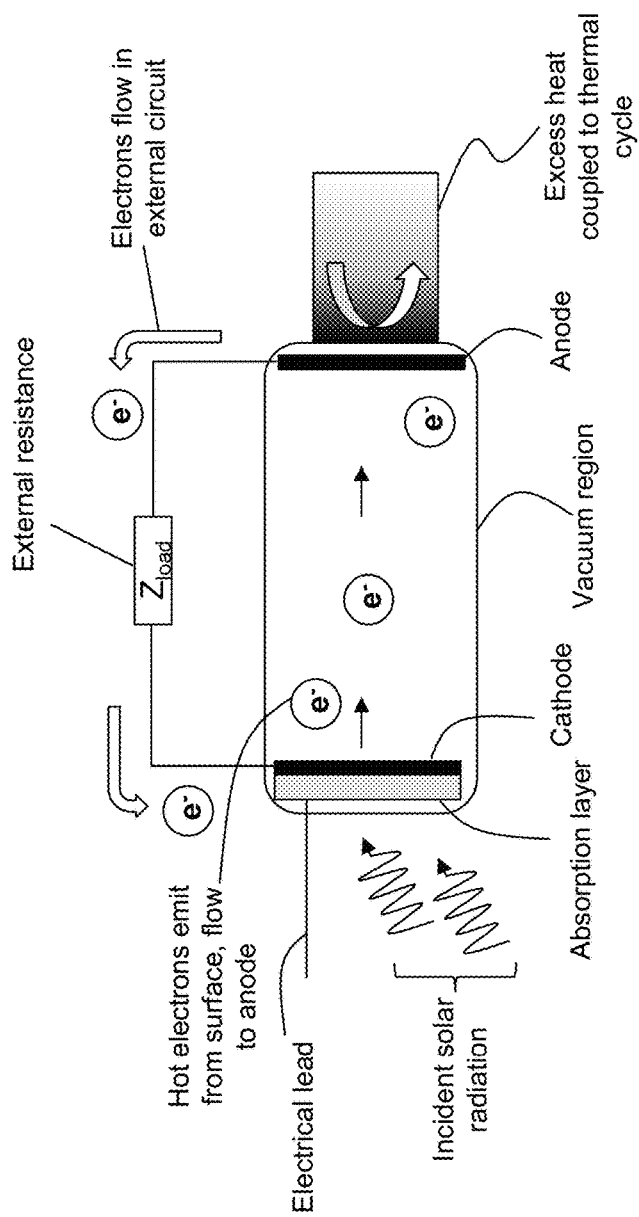

FIG. 8 is a schematic illustration of a photon-enhanced thermionic energy converter comprising an electron emitter device according to an illustrative embodiment.

Figure 9:
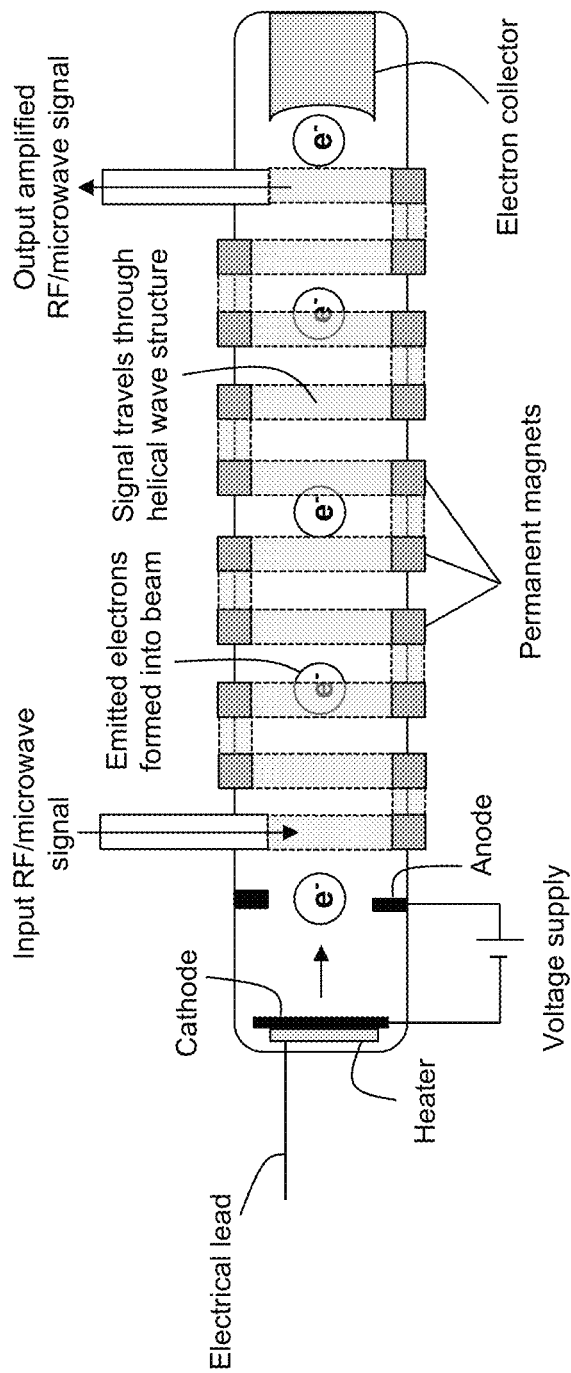

FIG. 9 is a schematic illustration of a traveling wave tube amplifier comprising an electron emitter device, the amplifier used for millimeter wave and high power radio frequency (RF)/microwave applications according to an illustrative embodiment.

DETAILED DESCRIPTION

Provided herein are electron emitter devices which comprise transition metal perovskite oxides and related methods.

In one aspect, an electron emitter device is provided, comprising a cathode comprising a transition metal perovskite oxide and an anode electrically coupled to the cathode and positioned to define an interelectrode conductive region between the anode and the cathode. Electrons are induced to emit from the surface of the transition metal perovskite oxide into the interelectrode conductive region upon receiving sufficient energy from an energy source, which may be operably coupled to the cathode. The emitted electrons are collected at the anode. The electron emitter device may comprise an enclosure configured to enclose the cathode, the anode, and the interelectrode conductive region. In some embodiments the enclosed space is evacuated to a vacuum. In alternative embodiments, the enclosed space is filled with another material, e.g., a solid, a liquid or a gas (or gas mixture). If the enclosed space is filled with a gas or gas mixture, the components of the gas and the pressure of the gas may be selected to ensure that the electron emitter device functions as desired. By way of illustration, the gas components may be selected such that they do not substantially alter the surface chemistry of the cathode in order to avoid altering the emission properties of the electron emitter device. Similarly, the pressure may be sufficiently low in order to minimize the absorption or deflection of emitted electrons by the gas components. A variety of energy sources may be used. The energy source may be a heat source in which case the electrons are emitted via thermionic emission. The energy source may be a voltage source in which case the electrons are emitted via field emission. The energy source may be a light source (e.g., solar radiation), in which case the electrons are emitted via photoemission.

An illustrative electron emitter device 700 is shown in FIG. 7. The electron emitter device 700 comprises a cathode 704 comprising a transition metal perovskite oxide and an anode 708 electrically coupled to the cathode 704 and positioned to define an interelectrode conductive region 712. The cathode is operably coupled to an energy source 716 (in this embodiment, a heater) configured to induce the emission of electrons 720 from the surface 724 of the transition metal perovskite oxide into the interelectrode conductive region 712. An enclosure 728 encloses the cathode 704 and the anode 708 such that a vacuum may be maintained in the space defined by the enclosure 728.

The transition metal perovskite oxide of the cathode may be a compound having Formula I, $ABO_3$, wherein A and B are cations, typically having different sizes (i.e., ionic radii). Formula I encompasses doped or alloyed transition metal perovskite oxides, i.e., compounds which include more than one type of A cation (e.g., two, three, etc.) in varying relative amounts (provided the sum of the amounts is about 1 atom per a structural A-site), more than one type of B cation (e.g., two, three, etc.) in varying relative amounts (provided the sum of the amounts is about 1 atom per a structural B-site), or both. By way of illustration, transition metal perovskite oxides having formula $(A_1)_{1-x}(A_2)_x(B_1)_{1-y}(B_2)_yO_3$, wherein x ranges from about 0 to about 1 and y ranges from about 0 to about 1 are encompassed by Formula I. With regards to the selection of $A_2$, $A_2$ may be a cation which is sufficiently electropositive and is present at a sufficient amount to establish a surface dipole in the transition metal perovskite oxide. The amount of $A_2$ may also be selected to provide a sufficient amount of $A_2$ to replenish any $A_2$ that may be desorbed from the surface of the transition metal perovskite oxide over time. This amount (and thus x) may be at least about 0.001, at least about 0.01, or at least about 0.1. The selection of A cations (and combinations thereof), B cations (and combinations thereof) and the relative amounts of the elements to provide transition metal perovskite oxide compounds exhibiting certain desirable properties is further described below.

In some embodiments, the transition metal perovskite oxide has Formula I, wherein A is selected from an alkaline earth element, a rare earth element, and combinations thereof. In some embodiments, A is selected from an alkaline earth element, a lanthanide, and combinations thereof. In some embodiments, A is selected from Mg, Ca, Sr, Ba, La, Pr, Sc, Y, and combinations thereof. In some embodiments, B is selected from 3d transition metal elements and combinations thereof. In some embodiments, B is selected from Sc, Ti, V, Cr, Mn, Fe, Co, Ni, and combinations thereof. In some embodiments, B is selected from 4d transition metal elements such as Nb.

In some embodiments, the transition metal perovskite oxide has Formula II, $AVO_3$, wherein A may be as defined above. Formula II also encompasses doped and alloyed transition metal perovskite oxides having more than one type of A cation. In some embodiments, the transition metal perovskite oxide has Formula III, $(A_1)_{1-x}(A_2)_xVO_3$, wherein $A_1$ and $A_2$ are independently selected from an alkaline earth element and a rare earth element. In some embodiments, $A_1$ and $A_2$ are independently selected from Mg, Ca, Sr, Ba, La, Sc, and Y. In some embodiments, the transition metal perovskite oxide is $Sr_{1-x}Ba_xVO_3$. As evidenced by the Examples, below, such transition metal perovskite oxides were found to exhibit surprisingly low work functions. This property is surprising, at least in part, because as compared to other A cations (e.g., La), Sr would be expected to attract electrons, thereby requiring more energy to move the electron out of the solid material. In addition, based on the results of the present disclosure, such transition metal perovskite oxides are expected to exhibit operating lifetime much longer than conventional dispenser cathode technologies, possibly orders of magnitude longer. Another illustrative transition metal perovskite oxide is $BaNbO_3$.

The formulas above also encompass compounds in which the amounts of the elements may deviate from ideal, e.g., non-stoichiometric compounds. The deviation may be up to about 10% in cations (A or B), e.g., up to about 6%, up to about 2%, up to about 0.5%, up to about 0.1%, etc. The deviation may be up to about 20% in oxygen, e.g., up to about 15%, up to about 10%, up to about 5%, up to about 1%, up to about 0.5%, etc. By way of illustration, this means that Formula I, $ABO_3$, encompasses the compounds $ABO_{2.98}$, $ABO_{2.5}$, $A_{0.95}BO_3$, etc.

The formulas above also encompass transition metal perovskite oxide compounds having different orderings of either the cations, anions, or both on a perovskite parent lattice, e.g., cubic perovskites, double perovskites, which also may be referred to as layered perovskites (where the layering refers to planes of ordered ion species in a perovskite lattice), and Brownmillerite phases.

In some embodiments, the transition metal perovskite oxide does not have the formula $(La,Ba,Sr)TiO_3$, wherein the relative amounts of La, Ba, Sr vary, provided the sum is about 1.

The transition metal perovskite oxide is desirably a compound which exhibits certain characteristics. As evidenced by the Examples, below, A cations (and combinations thereof) and B cations (and combinations thereof) may be selected to provide such properties and combinations of such properties. The transition metal perovskite oxide may be characterized by its work function. In some embodiments, the transition metal perovskite oxide exhibits a work function of less than about 2.50 eV. This includes embodiments in which the work function is less than about 2.20 eV, less than about 2.00 eV, less than about 1.80 eV, less than about 1.60 eV, less than about 1.40 eV, less than about 1.20 eV, less than about 1.00 eV, less than about 0.80 eV, or in the range of from about 0.8 eV to about 2.50 eV. Work function is defined via Equation 4 below and the work function values above can refer to values which have been calculated as described in the Examples, e.g., using Density Functional Theory and at a temperature of 0 K.

The work function of the transition metal perovskite oxide may be measured using experimental techniques such as ultraviolet or x-ray photoemission spectroscopy or Kelvin probe microscopy. The work function values above can refer to values which have been measured experimentally using these techniques. Measured work functions may be referred to as thermionic work functions. The work function values above can refer to values measured at a temperature range, e.g., about 500° C. to about 1500° C., or about 800° C. to about 1000° C. However, since the effect of temperature on work function is on the order of $\approx kT$ (where k is Boltzmann's constant), DFT-calculated, T=0 K work functions provide very good estimations of the corresponding high temperature thermionic work functions.

The transition metal perovskite oxide may be characterized by its conductivity. In some embodiments, the transition metal perovskite oxide exhibits a conductivity similar to that of graphite or better. In some embodiments, the conductivity is at least about $10^{-10}$ $\Omega^{-1}cm^{-1}$ at room temperature. This includes embodiments in which the conductivity is at least about $10^{-7}$ $\Omega^{-1}cm^{-1}$, at least about $10^{-4}$ $\Omega^{-1}cm^{-1}$, at least about $10^{-1}$ $\Omega^{-1}cm^{-1}$, at least about $10^{2}$ $\Omega^{-1}cm^{-1}$, at least about $10^{3}$ $\Omega^{-1}cm^{-1}$, at least about $10^{4}$ $\Omega^{-1}cm^{-1}$, at least about $10^{5}$ $\Omega^{-1}cm^{-1}$, or in the range of from about $10^{-4}$ $\Omega^{-1}cm^{-1}$ to about $10^{5}$ $\Omega^{-1}cm^{-1}$ at room temperature. Transition metal perovskite oxides exhibiting such conductivity are effective at transporting electrons to the surface from which the electrons are emitted, which ensures that the material has an ample supply of near-surface electrons. In addition, such conductivity values may allow the transition metal perovskite oxide to reach a uniform temperature both within its bulk and on its surface, which is useful for achieving a spatially uniform emission of electrons from the surface. Spatially uniform emission is useful for microwave and millimeter-wave applications which require a spatially homogeneous beam of electrons to operate most effectively. The conductivity of the transition metal perovskite oxide may be measured using known four-point probe experiments which measure conductivity of samples accurately by removing the contact resistance of the electrodes used in two-point probe experiments. The conductivity values above can refer to values which have been measured experimentally using this technique.

The transition metal perovskite oxide may be characterized by its band gap. In some embodiments, the transition metal perovskite oxide has a band gap of no more than about 2 eV. This includes embodiments in which the band gap is no more than about 1 eV. In some embodiments, the transition metal perovskite oxide has a band gap of about zero. The band gap of the transition metal perovskite oxide may be measured using experimental techniques such as ultraviolet photoelectron spectroscopy (UPS) or X-ray absorption and emission spectroscopies (XAS, XES). The band gap values above can refer to values which have been measured experimentally using these techniques.

The transition metal perovskite oxide may be characterized by the energy difference $\Delta$ between its O 2p-band center and $E_{Fermi}$. The O 2p-band center may be calculated from Equation 1, as described below and $E_{Fermi}$, is the energy of the highest filled electronic state. As evidenced by the Examples, below, this energy difference $\Delta$ was found to strongly correlate with work function. Transition metal perovskite oxide compounds having "deep" O 2p-band centers (relative to $E_{Fermi}$), exhibit lower work functions. In some embodiments, the transition metal perovskite oxide has an energy difference $\Delta$ of −3 eV or more (i.e., more negative). This includes embodiments in which the energy difference $\Delta$ is −4 eV or more, −5 eV or more, −6 eV or more, in the range of from about −6 eV to about −3 eV. The energy difference $\Delta$ values described above can refer to a value which is calculated via Equation 1 and Density Functional Theory (DFT) calculations using the Heyd, Scuseria, and Ernzerhof (HSE) hybrid functionals and a temperature of 0 K as described in the Examples, below. However, the energy difference $\Delta$ values can refer to a value which is measured experimentally. The position of O states relative to the Fermi level can be determined using x-ray absorption spectroscopy. (See, e.g., Hong, W. T., Shao-Horn, Y., et. al. "Probing $LaMO_3$ Metal and Oxygen Partial Density of States Using X-ray Emission, Absorption, and Photoelectron Spectroscopy", *Journal of Physical Chemistry C*, 2015, 119, 2063-2072.) The energy difference $\Delta$ values above can refer to values which have been measured experimentally using this technique.

The transition metal perovskite oxide may also be characterized by its chemical stability, including at high temperatures, e.g., up to about 500° C. or greater, about 850° C. or greater, about 1000° C. or greater, or about 1500° C. In some embodiments, the transition metal perovskite oxide is thermodynamically stable at such high temperatures. In some embodiments, the transition metal perovskite oxide may evolve at such high temperatures but is stable for long periods at such high temperatures.

The surface of the transition metal perovskite oxide from which electrons are emitted may be characterized by its crystallographic orientation and termination. In some embodiments, the surface comprises regions having (001) orientation. In some embodiments, the surface comprises regions which are AO-terminated. In some embodiments, the surface comprises regions having (001) orientation and which are also AO-terminated, i.e., regions which have (001) orientation and AO-termination. In some embodiments, the surface may be characterized as having substantially (001) orientation and/or being substantially AO-terminated. The term "substantially" is used to indicate that the entire surface may not have (001) orientation and/or that the entire surface may not be AO-terminated, but that enough of the surface adopts this orientation and/or termination that it would be considered to have predominantly (001) orientation and/or AO-termination. In other embodiments, a sufficient fraction of the surface has (001) orientation and AO-termination such that the surface exhibits a work function which is substantially similar to (e.g., within ±10%, ±5%, ±2%, ±1%, etc.) the work function of a surface which is substantially (001) orientated and substantially AO-terminated. In some embodiments, the fraction of the surface having (001) orientation and AO-termination is at least about 5%, at least about 10%, at least about 25%, at least about 50%. The work function of a surface comprising regions having different crystallographic orientations and terminations may be referred to as an "effective work function," since each region will be characterized by its own work function value. However, at high temperatures (e.g., about 500° C. to about 1500° C., or about 800° C. to about 1000° C.), electron emission from such a surface will be dominated by the regions characterized by relatively low work functions since emission current is exponential with work function.

The form of the transition metal perovskite oxide is not particularly limited. The cathode may be formed entirely of the transition metal perovskite oxide, which may be shaped into various forms (e.g., plate, wire, tube, etc.) depending upon the application. Such embodiments are distinguished from those in which the transition metal perovskite oxide is in the form of a layer, coating, or film on the surface of a substrate. However, in other embodiments, the transition metal perovskite oxide may be in the form of a layer, coating or film on the surface of a substrate. Various substrates may be used, depending upon the application. However, as the transition metal perovskite oxide itself can be the material from which the emitted electrons originate (i.e., originating from a conductive band of the transition metal perovskite oxide), the substrate is typically not one which emits electrons under the particular conditions of the application (although it may be). Similarly, as the transition metal perovskite oxide may exhibit an ultra-low work function, the transition metal perovskite oxide typically does not require a layer, coating or film of another material on its surface which further lowers its work function (although it may have such a layer).

Methods for making the transition metal perovskite oxides are known. Techniques may include simple mixing and sintering of precursor compounds; sol-gel deposition; sputtering; thin film growth techniques such as molecular beam epitaxy, etc.

The electron emitter devices find use in a variety of applications which require a regular, persistent flow of electrons. Illustrative applications include high power electron beam applications such as high power microwave or millimeter wave source technologies and thermionic energy conversion devices. An illustrative photon-enhanced thermionic energy converter comprising an electron emitter device is shown in FIG. 8. An illustrative traveling wave tube amplifier used for millimeter wave and high power radio frequency (RF)/microwave applications is shown in FIG. 9. In both figures, the cathodes comprising any of the present transition metal perovskite oxides are labeled. In the embodiment of FIG. 8, the absorption layer is a semiconductor layer, e.g., GaAs, configured to absorb sunlight to generate electrons in the conduction band of the semiconductor. The cathode may also be heated via the electrical lead. Additional, different, or fewer components than those illustrated in the embodiments of FIGS. 8 and 9 may be used.

In another aspect, a method of using the electron emitter device comprises applying energy to the cathode of the electron emitter device sufficient to induce the emission of electrons from the surface of the transition metal perovskite oxide into the interelectrode conductive region, and collecting the emitted electrons on the anode.

EXAMPLES

Example 1

Methods
Computational Details:

Calculations were performed using Density Functional Theory (DFT) as implemented by the Vienna ab initio simulation package (VASP)[8] with a plane wave basis set. The hybrid HSE exchange and correlation functional of Heyd, Scuseria and Ernzerhof[9] was used with Perdew-Burke-Ernzerhof (PBE)-type pseudopotentials[10] utilizing the projector augmented wave (PAW)[11] method for La, Ca, Mg, Ba, Sr, Sc, Ti, V, Cr, Mn, Fe, Co, Ni and O atoms. The fraction of Hartree-Fock (HF) exchange in the HSE method for each material was obtained from Refs. [12] and [13]. In Refs. [12] and [13], the fraction of HF exchange was fitted to reproduce the experimentally-measured bulk band gap and densities of states from ultraviolet photoemission spectroscopy (UPS) measurements. Thus, the fractions of Hartree-Fock exchange used in the HSE calculations were 0.25 ($LaScO_3$), 0.15 ($LaTiO_3$, $LaCrO_3$, $LaMnO_3$, $LaFeO_3$), 0.125 ($LaVO_3$), 0.05 ($LaCoO_3$) and 0 ($LaNiO_3$). For the band insulators $SrTiO_3$ and $LaAlO_3$, a value of 0.25 was used for the HF exchange fraction.[14,15] For the remaining materials, the HF exchange values used were the same as the respective transition metal-containing lanthanide perovskite. Therefore, for $SrVO_3$, $SrFeO_3$, $SrCoO_3$, $Ba_{0.5}Sr_{0.5}CO_{0.75}Fe_{0.25}O_3$ (BSCF) and $La_{1-x}Sr_xMnO_3$ (LSM), the HF values used were 0.125, 0.15, 0.05, 0.05 and 0.15, respectively. This method of tuning the amount of HF exchange to reproduce experimental bulk electronic structure properties such as the band gap has been shown to provide more accurate Li insertion voltages (a quantity that depends sensitively on the electronic structure near the Fermi level) than the default HF exchange of 0.25 for a wide range of transition metal oxide materials.[16]

The valence electron configurations of the atoms utilized in the calculations were La: $5s^25p^66s^25d^1$, Ca: $3s^23p^64s^2$, Mg: $2s^22p^63s^2$, Ba: $5s^25p^66s^2$, Sr: $3s^23p^64s^2$, Sc: $3s^23p^64s^23d^1$, Ti: $3s^23p^64s^23d^2$, V: $3p^64s^13d^4$, Cr: $3p^64s^13d^5$, Mn: $3p^64s^23d^5$, Fe: $3s^23p^64s^13d^7$, Co: $4s^13d^8$, Ni: $3p^64s^23d^8$, Al: $3s^23p^1$ and O: $2s^22p^4$ respectively. The plane wave cutoff energies were, at a minimum, 30% larger than the maximum plane wave energy of the chosen pseudopotentials, and equal to a minimum of 405 eV for all systems. All calculations were performed with spin polarization. The Monkhorst-Pack scheme was used for reciprocal space integration in the Brillouin Zone for bulk perovskite materials.[17] For surface calculations a F-centered reciprocal space integration scheme was used instead of Monkhorst-Pack as only one k-point was used, and the electronic minimization was performed simultaneously for all energy bands. A 2×2×2 k-point mesh was used for the 2×2×2 bulk supercells of all $LaBO_3$ materials (40 atoms per cell), with total energy convergence (ionic and electronic degrees of freedom) of 3 meV per formula unit. For surface slab calculations, the k-point mesh was reduced to 1×1×1 and maintained a minimum vacuum distance of 15 Å. It was verified that all calculated work functions were well-converged (error of approximately +/−0.1 eV) with respect to both slab thickness and vacuum region thickness, with the exception of $LaAlO_3$ and $LaScO_3$, which are highly polar materials and with work functions which converge very slowly with slab thickness. Therefore, work function results for $LaScO_3$ and $LaAlO_3$ have a larger error of approximately +/−0.4 eV, based on GGA calculations of symmetric (001) surface slabs of $LaAlO_3$ between 5 and 17 layers. Lastly, the dipole correction was implemented in VASP to ensure vacuum level convergence, and the dipole correction was calculated only in the axial direction normal to the terminating surface.

Perovskite Bulk and Surface Calculations.

In this Example, a total of 18 technologically relevant perovskite materials were considered: $LaBO_3$ (B=Sc, Ti, V, Cr, Mn, Fe, Co, Ni), $SrBO_3$ (B=Ti, V, Fe, Co), $La_{1-x}Sr_xMnO_3$ (x=0.0625, 0.125, 0.25, 0.375) (LSM), $LaAlO_3$ and $Ba_{0.5}Sr_{0.5}Co_{0.75}Fe_{0.25}O_3$ (BSCF). The specific compositions of LSM and BSCF were included due to the high technological relevance of these materials in solid oxide fuel cell and oxygen permeation membrane technology.[18-20] Each of the separate $LaBO_3$ bulk materials were simulated as a pseudocubic 2×2×2 supercell (40 atoms, see FIG. 1) while the $SrBO_3$ bulk materials were simulated with an ideal cubic 2×2×2 (40 atoms) supercell. All bulk materials were subject to a relaxation of volume plus ions, followed by a second relaxation of ions only. However, lattice parameters were kept equal to each other and at right angles to simulate high-temperature cubic or pseudo-cubic structures, as done by Lee, et. al.[21] All materials which exhibit some form of magnetic ordering were simulated as ferromagnetic, even if their true ground state is not ferromagnetic. For example, $LaCrO_3$ and $LaFeO_3$ have G-type antiferromagnetic ground states while $LaMnO_3$ has the A-type antiferromagnetic ground state. The use of ferromagnetic ordering for all systems is justified. For example, the applications of high power electron beams and thermionic energy conversion require electron-emitting surfaces maintained at approximately 1000° C. and 500° C., respectively. At these elevated temperatures most perovskite materials become paramagnetic.[21-23] Ferromagnetic structures thus provide a consistent and simplified set of magnetic structures to investigate the work function trends and physics of these materials. It has been found that changing from ferromagnetic to antiferromagnetic for the cases of $LaMnO_3$ and $LaFeO_3$ ordering yielded a calculated work function change on the order of 0.1 eV. This change in the work function with ferromagnetic versus antiferromagnetic ordering is small compared to work function differences between different materials, and is not expected to qualitatively change the trends demonstrated here. It was assumed that this magnitude of work function difference as a function of magnetic ordering is typical for these materials, and thus, every material was modeled with ferromagnetic ordering. The initial bulk 3d electron arrangements for each transition metal in $LaBO_3$ were, with a nominal 3+ oxidation state: Ti: $d^1$ ($t_{2g}^1$), $\mu_B$=1, V: $d^2$ ($t_{2g}^2$), $\mu_B$=2, Cr: $d^3$ ($t_{2g}^3$), $\mu_B$=3, Mn: $d^4$ ($t_{2g}^3 e_g^1$), $\mu_B$=4 (high spin), Fe: $d^5$ ($t_{2g}^3 e_g^2$), $\mu_B$=5 (high spin), Co: $d^6$ ($t_{2g}^5 e_g^1$), $\mu_B$=2 (intermediate spin), Ni: $d^7$ ($t_{2g}^6 e_g^1$), $\mu_B$=1 (low spin). The initial bulk 3d electron arrangements for each transition metal in $SrBO_3$ were, with a nominal 4+ oxidation state: Ti: $d^0$ ($t_{2g}^0$), $\mu_B$=0, V: $d^1$ ($t_{2g}^1$), $\mu_B$=1, Fe: $d^4$ ($t_{2g}^3 e_g^1$), $\mu_B$=4 (high spin), Co: $d^5$ ($t_{2g}^4 e_g^1$), $\mu_B$=3 (intermediate spin). In all cases, the fully relaxed spin states were very close to the initial values. $LaCoO_3$ has been shown to exist in different spin states, including low spin,[24] intermediate spin and high spin. The usage of the intermediate spin state of Co is justified as this state, or some form of spin mixture which might be reasonably approximated through intermediate spin, has been shown to exist at room and higher temperatures.[24-26]

The work function calculations were performed using (001) AO and $BO_2$ terminations for each of the $ABO_3$ materials. FIG. 1 shows the different ways to create (001) perovskite surface terminations: the surface slabs can be stoichiometric and asymmetric with one surface terminated by AO and one surface terminated by $BO_2$, or the surface slabs can be non-stoichiometric but symmetric whereby both terminating surfaces are either AO-terminated or $BO_2$-terminated. The (001) surface terminations were used because both experimental and computational work has shown these surfaces are the most stable surface terminations for many perovskite systems. References [27] and [28] show via DFT calculations that the (001) perovskite terminations are more stable than the (011) and (111) surfaces in the cases of $La_{1-x}Sr_xCo_{1-y}Fe_yO_3$ and $LaMnO_3$, respectively. Recent experimental and computational work by a number of authors suggest that many transition metal perovskite materials can be predominantly (001) AO-terminated.[29-34] The fact that the AO termination of (001) perovskites tends to be stable is important for the present Example as AO-terminated perovskite surfaces exhibit much lower work functions than $BO_2$-terminated surfaces (see "$ABO_3$ calculated work functions"). In the present Example, all surface slabs (except $La_{1-x}Sr_xMnO_3$) were simulated with 9 layers that were either AO- (88 atoms per supercell) or $BO_2$- (92 atoms per supercell) terminated. The top two atomic layers of each surface were allowed to relax while the remainder of the surface slab was frozen to be bulk-like $ABO_3$. For the calculations of $La_{1-x}Sr_xMnO_3$ surfaces, 8-layer asymmetric slabs were used in order to maintain the same Sr concentration for calculations of the AO and $BO_2$ work functions, since if symmetric slabs were used then the total number of A-site atoms would change when considering the symmetric AO termination versus the symmetric $BO_2$ termination. The placement of Sr within the $La_{1-x}Sr_xMnO_3$ surface slabs was performed as follows. For Sr concentrations of x=0.0625, 0.125, and 0.25, one Sr was placed on the AO-terminated surface (surface concentration of 25% A-site fraction) while the remaining Sr were ordered through the AO planes of the simulation cell such that all Sr were as far as possible from each other. For Sr content of x=0.375, the x=0.25 structure was used with the additional Sr placed on the terminating surface in order to reflect the tendency of Sr segregation to the surface in this material.[35,36] It was verified for a single Sr concentration of x=⅛ that increasing the slab thickness from 8 to 12 layers resulted in a work function change of less than 0.05 eV, indicating satisfactory convergence. Therefore, reported work functions for $La_{1-x}Sr_xMnO_3$ surfaces using 8 layer slabs should be sufficiently accurate.[35]

From the standpoint of formal valences, all $LaBO_3$ materials are considered part of the "3-3" perovskites, meaning that both cations adopt a nominally 3+ oxidation state, while O has its typical 2− oxidation state. When the A-site contains Sr in place of La, Sr adopts a 2+ oxidation state and the B-site cation oxidizes from 3+ to 4+, so for example $SrCoO_3$ and BSCF materials are "2-4" perovskites. For 3-3 perovskites, each AO layer is nominally 1+ while each $BO_2$ layer is nominally 1−. The stoichiometric, asymmetric termination shown in FIG. 1 has ionic layers that alternate +/−/+/−, with a positively charged AO termination on one side and a negatively charged $BO_2$ termination on the other. This creates an energy that diverges with slab thickness unless the dipole is screened, and has been termed the polar catastrophe.[37,38] For surface slabs simulated using DFT, this surface geometry creates a very large surface dipole that, in the calculations, must be compensated by a movement of charge across the surface slab, i.e. an electronic reconstruction. This electronic reconstruction tends to create large changes in the electronic structure of the material, for example highly polar perovskites will move large amounts of charge to compensate the large surface dipole which can lead to surface metallization in insulators.[35] By contrast, the symmetric slabs shown in FIG. 1 which are terminated either with both surfaces as AO or both surfaces as $BO_2$ will not exhibit the large surface dipole, and a perovskite which shows bulk insulating properties will retain its insulating nature in the surface slab. These symmetric surface slabs are off-stoichiometric, therefore an electron excess (deficiency) will result for the AO- ($BO_2$-) terminated systems. Therefore, the symmetric AO-terminated system represents the n-type (low work function) limit while the symmetric $BO_2$-terminated system represents the p-type (high work function) limit for each material. Therefore, it is expected in the case of experimentally measured pure systems that the observed work functions may vary between values reported here for the n-type (AO-terminated) and p-type ($BO_2$-terminated) limits. For perovskites which have a band gap, it is also possible to further tune the value of the work function by doping extrinsic elements to move the Fermi level to a more p-type (higher work function)[39] or n-type (lower work function) value. However, one should not generally expect that a shift in Fermi level by bulk doping of an insulator will result in an equal corresponding change in the work function. This lack of simple correlation may be the result of interactions between the bulk dopants and surface dipoles, which yield a more complex cumulative effect of bulk Fermi level and surface dipole changes on the work function.[2] For the 3-3 perovskites it is expected that the symmetric slabs are more physically representative of (001) perovskite films in the thick film limit (where the terminating surfaces are independent of each other) because the polarity is completely compensated.[35] For materials that can easily move electrons to compensate the surface polarity (e.g. $LaMnO_3$, $LaNiO_3$), one can use thinner slabs such as an 8 layer asymmetric slab and obtain the same answer for the calculated work function (i.e. the work function converges quickly with increasing slab thickness). For materials that are very insulating such as $LaScO_3$ and $LaAlO_3$, movement of electrons to compensate the polarity of the asymmetric slab is difficult and convergence of the work function with slab thickness requires many layers, in some cases dozens.[35]

In "O 2p-band center as an electronic structure descriptor" the O 2p-band center $\overline{O}_{2p}(E)$ is used. $\overline{O}_{2p}(E)$ is the centroid of the electronic density of states projected onto the O 2p orbitals referenced to an energy level (here the Fermi energy $E_{Fermi}$ is used) and was calculated as:

$$\overline{O}_{2p}(E) = \frac{\int_{-\infty}^{\infty} E \cdot D_{O_{2p}}(E) dE}{\int_{-\infty}^{\infty} D_{O_{2p}}(E) dE} - E_{Fermi}, \quad \text{Equation (1)}$$

where $D_{O_{2p}}$ (E) is the density of states projected onto the O 2p orbitals. In Eq. (1), the integrals were taken over all electronic states. The numerator is also called the first moment of the projected density of states, and the denominator is the integral over the projected density of states, yielding the electron occupation for the 2p orbitals of oxygen. In all cases, the bulk $ABO_3$ materials were used for the O 2p band center calculations, and this point will be stressed in the following discussion.

In "$SrVO_3$ as a low work function, metallic perovskite" additional surface terminations of $SrVO_3$ were examined. Therefore, it becomes important to ascertain which crystallographic surface termination is the most stable one, as an experimentally measured effective work function depends on the proportion of each surface termination present. The surface energy is defined as the formation energy to create a specific surface termination from the equivalent amount of bulk material, and is normalized by the surface area. For a stoichiometric slab such as (011) terminations, the surface energy γ is calculated as:

$$\gamma = \frac{1}{2A}(E_{x,surface} - xE_{bulk}), \quad \text{Equation (2)}$$

where A is the surface area, $E_{x,surf}$ is the total energy of a surface slab containing x formula units, and $E_{bulk}$ is the total energy of a single formula unit in the bulk form. The quantity in the parenthesis represents the energy difference between the equivalent amount of material in a surface slab versus bulk form. The factor of 2 is present because the slab contains two surfaces. For the (001) and (111) symmetric slab calculations, the surface slabs are off-stoichiometric. Therefore, the energies of the two slab terminations (e.g. AO (001) and $BO_2$ (001)) must be added together and the resultant surface energy is thus an average of the two surface terminations:

$$\gamma = \frac{1}{4A}((E_{x,surface1} + E_{y,surface2}) - (x+y)E_{bulk}), \quad \text{Equation (3)}$$

where $E_{x,surface1}$ is the total energy of the first surface termination containing x formula units, $E_{y,surface2}$ is the total energy of termination 2 containing y formula units, and the factor of 4 is present because the addition of two separate slab calculations means there are actually four surfaces being formed instead of two.

Calculating the Work Function.

The work function Φ of a material is the energy required to pull an electron from the Fermi level $E_{Fermi}$ (electron chemical potential) to the vacuum level $E_{vac}$:

$$\Phi = E_{vac} - E_{Fermi}, \quad \text{Equation (4)}$$

$E_{vac}$ is the energy level at which the electron has zero kinetic energy at a semi-infinite distance away from the surface and the image charge restoring force on it can be considered negligible. The work function can be measured using experimental techniques such as ultraviolet or x-ray photoemission spectroscopy, Kelvin probe microscopy, and calculated with Density Functional Theory (DFT). Using DFT, the work function of any surface can be determined by calculating the electrostatic potential energy, identifying $E_{vac}$, calculating $E_{Fermi}$, and subtracting $E_{Fermi}$ from $E_{vac}$.

Introduction

Knowledge of work function values of different crystallographic orientations and terminations is valuable for engineering specific surface and interfacial properties for applications including charge injection layers, electrocatalysts, and thermionic electron or field emission-based high power devices. A detailed analysis of the physics governing the work functions of perovskite oxides has not been previously established. In this Example, the work function trends of a series of perovskite ($ABO_3$ formula) materials were examined using Density Functional Theory. The results show that the work functions of (001)-terminated AO- and $BO_2$-oriented surfaces can be described using concepts of electronic band filling, bond hybridization, and surface dipoles. An approximately linear correlation between perovskite work functions and the bulk oxygen band center was found. This correlation with oxygen band center enables both understanding and rapid prediction of trends in work function. Finally, $SrVO_3$ was identified as a stable, low work function, highly conductive material for a new electron emission cathode for application in high power beam devices and as a potential electron emissive material for thermionic energy conversion technologies.

Results and Discussion

Figure 1A:
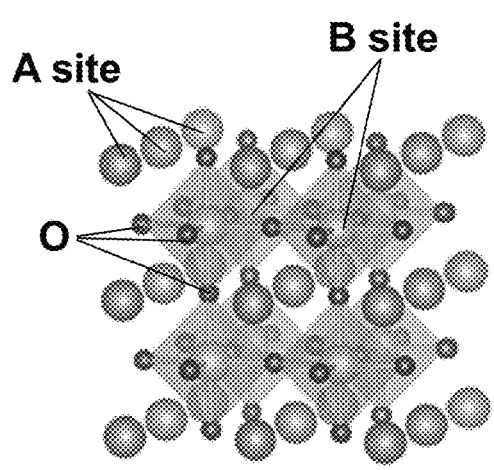
FIGS. 1A-1B show the crystal structures for (FIG. 1A) ideal cubic perovskite and (FIG. 1B) pseudocubic perovskite phases. In both (FIG. 1A) and (FIG. 1B) the largest, corner atoms are the A site cations, the atoms at the center of the octahedra are the B site cations, and the other atoms are O. These structures depict high temperature pseudocubic phases that were derived from experimental (FIG. 1A) Pm$\bar{3}$m (cubic) and (FIG. 1B) Pbnm (orthorhombic) and R$\bar{3}$c (rhombohedral) symmetries.
Figure 1B:
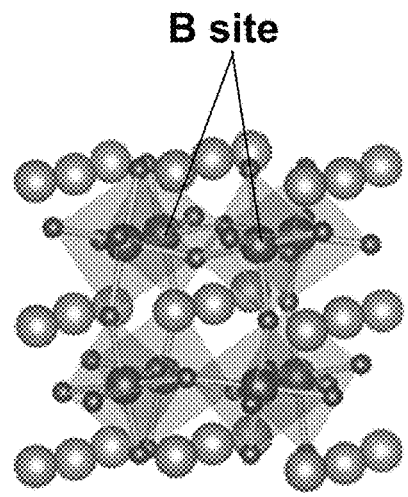
Figure 1C:
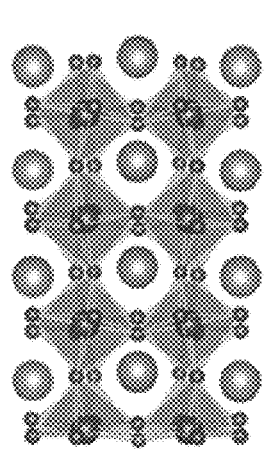
FIGS. 1C-1E show structure models of $ABO_3$ surface slabs (FIG. 1C): asymmetric, stoichiometric, (FIG. 1D): symmetric and AO terminated, nonstoichiometric, and (FIG. 1E): symmetric and $BO_2$ terminated, nonstoichiometric.
Figure 1D:
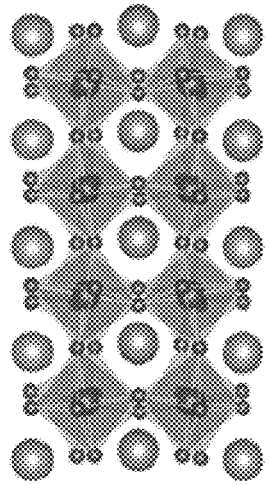
Figure 1E:
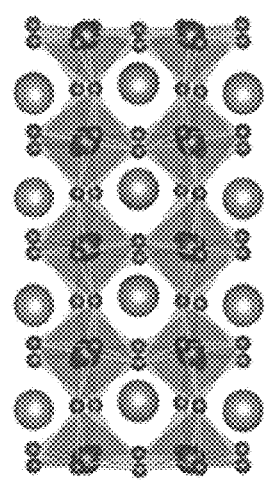

High temperature 2×2×2 pseudocubic structures adopted from ideal cubic $ABO_3$ perovskite (Pm$\bar{3}$m, $SrTiO_3$, $SrVO_3$, $SrFeO_3$, $SrCoO_3$, $Ba_{0.5}Sr_{0.5}Co_{0.75}Fe_{0.25}O_3$), orthorhombic perovskite (Pbnm, $LaScO_3$, $LaTiO_3$, $LaVO_3$, $LaCrO_3$, $LaMnO_3$, $La_{1-x}Sr_xMnO_3$, $LaFeO_3$), and rhombohedral perovskite (R$\bar{3}$c, $LaCoO_3$, $LaNiO_3$) examined in this study are shown in FIGS. 1A-1B. FIG. 1C shows the asymmetric (used for $La_{1-x}Sr_xMnO_3$) and FIGS. 1D-1E shows the symmetric (used for all other materials) surface slabs used for the work function calculations.

$ABO_3$ Calculated Work Functions.

Figure 2:
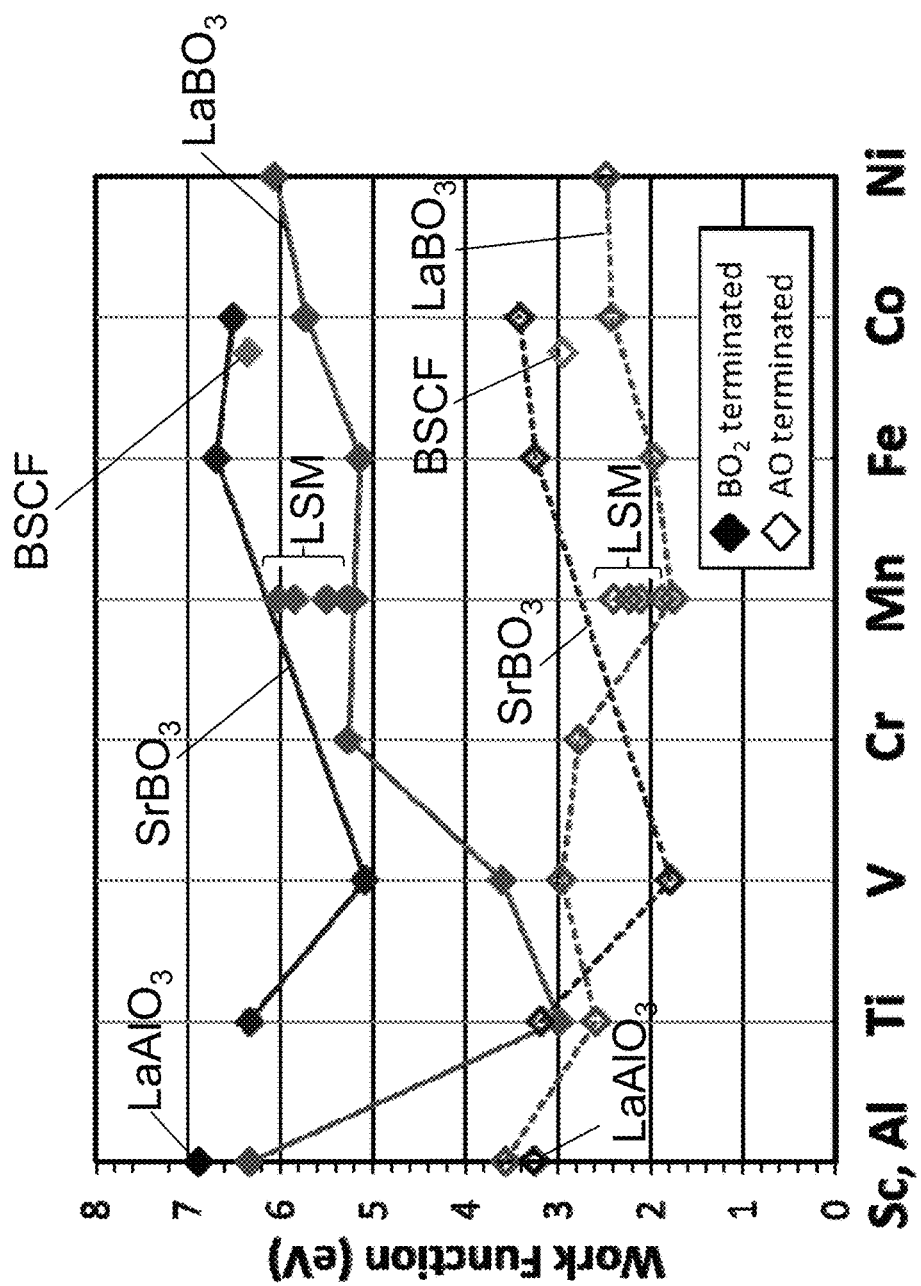
FIG. 2 shows the trend of (001) AO- and $BO_2$-terminated surface work functions for the 18 perovskite materials studied in the Examples as a function of B-site element across the periodic table. The solid (open) symbols connected with a solid (dashed) line are the $BO_2$ (AO) work functions, respectively. The $LaBO_3$, $SrBO_3$, LSM, $LaAlO_3$ and BSCF series of materials are labeled in the figure.

FIG. 2 is a plot of the calculated work functions for the AO- and $BO_2$-surface terminations versus composition of the B-site element for all 18 materials considered. Since the B-site element changes from Sc through Ni, FIG. 2 is a plot of how the AO and $BO_2$ work functions for perovskite materials change as B-site cations move across the 3d series of the periodic table. Table 1 contains the calculated work functions for the AO- and $BO_2$-terminated (001) surfaces for all $ABO_3$ materials considered in this Example. The O-bond ionicities are also provided, and were calculated using Bader charge analysis of atomic charges of bulk $ABO_3$ materials. [40,41] An O-bond ionicity equal to 1 indicates that the charge state of the O atoms in the $ABO_3$ material is −2, i.e. that the O-bond is completely ionic. Generally, chemical bonding has mixed covalent and ionic character, therefore the calculated atomic charges from the Bader analysis will be less than −2 (for example, an O atomic charge of −1.5 yields a bond ionicity of −1.5/−2=0.75). The O-bond ionicities in Table 1 will be referenced in upcoming qualitative discussions of work function trends for these materials. For the $LaBO_3$ series, the LaO work functions range between 1.76 eV ($LaMnO_3$) to 3.57 eV ($LaScO_3$) while the $BO_2$ work functions range from 2.72 eV ($LaTiO_3$) to 6.87 eV ($LaAlO_3$), and tend to increase in magnitude for Ti through Ni. For the $SrBO_3$ series, the SrO work functions range between roughly 1.86 eV ($SrVO_3$) to 3.42 eV ($SrCoO_3$) while the $BO_2$ work functions range from 5.09 eV ($SrVO_3$) to 6.68 eV ($SrFeO_3$).

TABLE 1

Summary of HSE calculated work functions for all (001) surfaces of $ABO_3$ materials considered in this Example. Also listed are the ionicities of the O-bonds for each material, which were calculated from Bader charge analysis of the bulk materials. A decrease in bonding ionicity is indicative of greater hybridization of the B 3d bands and O 2p bands.

| Material | AO WF(eV) | $BO_2$ WF(eV) | O bond ionicity |
|---|---|---|---|
| $LaScO_3$ | 3.57 | 6.32 | 0.716 |
| $LaTiO_3$ | 2.59 | 2.99 | 0.684 |
| $LaVO_3$ | 2.97 | 3.60 | 0.664 |
| $LaCrO_3$ | 2.77 | 5.27 | 0.665 |
| $LaMnO_3$ | 1.76 | 5.21 | 0.653 |
| $LaFeO_3$ | 1.98 | 5.14 | 0.637 |
| $LaCoO_3$ | 2.42 | 5.73 | 0.599 |
| $LaNiO_3$ | 2.47 | 6.06 | 0.559 |
| $LaAlO_3$ | 3.25 | 6.87 | 0.879 |
| $SrTiO_3$ | 3.18 | 6.33 | 0.655 |
| $SrVO_3$ | 1.86 | 5.09 | 0.601 |
| $SrFeO_3$ | 3.24 | 6.68 | 0.556 |
| $SrCoO_3$ | 3.42 | 6.51 | 0.537 |
| $Ba_{0.5}Sr_{0.5}Co_{0.75}Fe_{0.25}O_3$ | 2.94 | 6.35 | 0.540 |
| $La_{0.9375}Sr_{0.0625}MnO_3$ | 2.11 | 5.28 | 0.650 |
| $La_{0.875}Sr_{0.125}MnO_3$ | 2.23 | 5.49 | 0.647 |
| $La_{0.75}Sr_{0.25}MnO_3$ | 1.87 | 6.02 | 0.643 |
| $La_{0.625}Sr_{0.375}MnO_3$ | 2.39 | 5.85 | 0.637 |

Perhaps the most striking feature of the work functions is that the AO surfaces have lower work function values than $BO_2$ surfaces in all cases. Qualitatively, this can be understood in terms of the surface dipoles. The alternating layers of the (001) orientation are AO/$BO_2$/AO/$BO_2$, which, when considering formal charges, alternates +/−/+/−. A positive surface dipole is a dipole with an outwardly pointing positive charge, while a negative surface dipole has an outwardly pointing negative charge. Thus it is seen that the AO termination forms a positive surface dipole that lowers the work function, and the $BO_2$ surface forms a negative surface dipole that increases the work function.

The trend of increasing $BO_2$ work function when proceeding from left to right on the periodic table along the 3d row can be understood from the standpoint of transition metal electronegativities. When proceeding from Ti to Ni, the electronegativity of the transition metal ion is increasing as the 3d band fills. As a result, the 3d bands shift lower in energy as they fill and the work function increases. For the materials $LaScO_3$, $LaAlO_3$ and $SrTiO_3$, the 3d bands are nearly empty and these materials behave as band insulators. Interestingly, these materials have nearly the same $BO_2$ and AO work function values within a few tenths of an eV. This suggests that, in the absence of 3d electrons, it is the O 2p band that is effectively setting the value of the work function. This trend will be discussed in more detail in "Work function trends: band perspective" and "O 2p-band center as an electronic structure descriptor."

From Table 1, it is evident that as the 3d band fills, the bonding ionicity decreases. This trend is equivalent to saying that the B 3d and O 2p bands are becoming more hybridized. In addition, for the SrBO$_3$ materials where the B element is in the 4+ oxidation state, the bond ionicities are lower and thus the B 3d and O 2p bands are more hybridized than the analogous LaBO$_3$ systems where the B element is in the 3+ oxidation state. These trends of B 3d-O 2p band hybridization are consistent with a joint experimental and computational work by Suntivich and coworkers that showed how B 3d– O 2p band hybridization changes as a function of 3d band filling using O K-edge x-ray absorption and DFT calculations on a series of perovskite and Ruddlesden-Popper materials.[42] The increased B 3d–O 2p band hybridization means there is greater overlap of the B 3d and O 2p bands, and the O 2p band becomes closer to $E_{Fermi}$. Therefore, these trends illustrate that materials with greater band hybridization will have higher BO$_2$ work functions and O 2p bands that are closer to $E_{Fermi}$. Both of these points will be expanded upon in "Work function trends: band perspective" and "O 2p-band center as an electronic structure descriptor."

Interestingly, the trend of increasing BO$_2$ work function with increased filling of the B 3d band is not present for the AO work function. The AO work function trend is approximately flat with values of approximately 2-3 eV regardless of the B-site element. A fixed AO surface would be expected to have a work function that follows the trends set by the changing 3d band levels, just as the BO$_2$ surface appears to do. Instead, the expected trends of AO work function values are suppressed almost entirely by differences in the AO surface dipole between these materials. The difference in the surface dipole between the AO and BO$_2$ surfaces is simply proportional to the difference in their work functions $\Delta\Phi$ through the Helmholtz equation, which has the form $$\Delta\Phi = \frac{-e}{\varepsilon_0 A} |\vec{p}_z|,$$

where e is electronic charge, $\varepsilon_0$ is the vacuum permittivity, A is surface area and $|\vec{p}_z|$ is the dipole magnitude normal to the surface. However, since the BO$_2$ surface work function is changing as expected with the bulk Fermi level and band filling while the AO work function is not, it can be said with confidence that the BO$_2$ surface dipole is relatively constant while it is the AO surface whose dipoles are changing with the B-site cations.

The constant dipole on the BO$_2$ surface can be understood by inspecting the densities of states of these materials and from the schematic band structures shown in FIGS. 3A-3C. These densities of states show that for materials containing 3d electrons the states at $E_{Fermi}$ are dominated by B 3d with O 2p states. Furthermore, the O 2p band remains largely fixed in energy. A possible reason that BO$_2$ surfaces exhibit a nearly constant surface dipole is because the electrons at $E_{Fermi}$ are already at the terminating surface, and don't have to pass through an additional AO layer as they are emitted into vacuum. In this way, emission from the BO$_2$ surface may be the result of $E_{Fermi}$ being pinned at the surface by the B 3d states, and is thus dominated by the B 3d band filling and $E_{Fermi}$ position, while emission from the AO surface can be thought of as taking an electron from $E_{Fermi}$, which is comprised of mostly mixed B 3d and O 2p states in the BO$_2$ layer, and moving it through the positively-oriented AO surface dipole layer to emit into vacuum.

Doping Sr into LaMnO$_3$ to produce LSM resulted in an increase of the AO and BO$_2$ work functions for all Sr concentrations, however the increase in the work function is not monotonic with increasing Sr content. This lack of monotonic behavior is most likely a result of the specific Sr ordering chosen. When replacing La$^{3+}$ with Sr$^{2+}$, the system becomes more oxidized, i.e. it becomes hole-doped. This is evident from the work function data for the LSM series, where increasing the A-site Sr content tends to increase the work function of both surfaces and decrease the ionicity of the O-bonding. The fact that all BO$_2$ and most AO SrBO$_3$ material work functions are higher than their corresponding LaBO$_3$ work functions (with the exception of AO-terminated SrVO$_3$) demonstrates that doping Sr in place of La should raise the work function of the perovskite. Interestingly, BSCF has a lower work function than both SrFeO$_3$ and SrCoO$_3$, suggesting that doping Ba in place of Sr results in a lowering of the work function for Sr-based perovskites. The effect of Ba doping on the SrVO$_3$ work functions will be examined further in "SrVO$_3$ as a low work function, metallic perovskite.". The AO-terminations of SrVO$_3$, LaMnO$_3$ and LaFeO$_3$ have the lowest calculated work functions of 1.86 eV and 1.76 eV, and 1.98 eV respectively, making them desirable for low-work-function, electron-emission cathode materials. Of these materials, SrVO$_3$ also offers metallic conductivity, ability to be synthesized as both a bulk powder[43,44] and (001)-oriented thin film,[45] and structural stability at high temperatures.[43,44,46] SrVO$_3$ is studied in more detail in "SrVO$_3$ as a low work function, metallic perovskite."

Work Function Trends: Band Perspective.

FIGS. 3A-3C is a density of states schematic that illustrates the trend of BO$_2$ work functions from FIG. 2 by comparing the density of states of an insulating material with an empty 3d band and high ionicity (small amount of B 3d– O 2p hybridization) such as LaScO$_3$ (FIG. 3A), a less ionic material (large amount of B 3d– O 2p hybridization) with half or mostly filled 3d band such as LaNiO$_3$ (FIG. 3B) and a metallic, medium ionicity material (medium amount of B 3d– O 2p hybridization) with a minimally occupied 3d band such as SrVO$_3$ (FIG. 3C). The vacuum level, Fermi level and O 2p-band center are denoted as $E_{vac}$, $E_{Fermi}$, and $\overline{O}_{2p}(E)$, respectively. The position of $E_{Fermi}$ is at the energy of the highest filled electronic state. The O 2p states are shown in red and the B 3d states are shown in blue. The states that are shaded are filled states. In FIGS. 3A-3C, the approximation was made that the O 2p bands remain at a fixed energy level. While this is not rigorously true, the O 2p bands move only a few tenths of an eV in energy relative to the vacuum level, which is small compared to the multiple eV energy change of the B 3d bands as a function of the B-site composition. Maintaining a constant level of the O 2p band provides a more straightforward and intuitive way to demonstrate how the work function varies with bond ionicity/hybridization and also how the value of the O 2p band center (x-axis in FIG. 4) physically relates to the calculated work function values. The $\Delta$ values indicate the energy difference between the O 2p-band center and $E_{Fermi}$, equivalent to the x-axis of FIG. 4. In FIG. 3A, the insulating perovskite with empty 3d band has very deep O 2p bands which results in a deep $E_{Fermi}$, an O 2p-band center close to $E_{Fermi}$ and high work function. In FIG. 3B, the perovskite with partially filled 3d band has a large amount of O 2p-metal 3d band hybridization (i.e. lower ionicity/higher covalency) which results in higher occupied electron energy states, an O 2p-band center further from $E_{Fermi}$ compared to FIG. 3A, and a slightly lower work function. In FIG. 3C, the metallic perovskite with minimally filled 3d band has less O 2p– metal 3d band hybridization than the case in FIG. 3B, which results in an occupied portion of the B 3d band that is more empty, less hybridized and is higher in energy. Since the occupied portion of the B 3d band is higher in energy, $E_{Fermi}$ is also higher. Overall, this leads to an O 2p-band center that is further from $E_{Fermi}$ and a lower work function.

O 2p-Band Center as an Electronic Structure Descriptor.

Having demonstrated qualitative work function trends with changing A- and B-site composition for the $ABO_3$ materials investigated here, the focus was turned to developing a greater understanding of the physics governing the value of the work function in these perovskite materials. To accomplish this, the O 2p-band center was used as an electronic structure descriptor, as this variable has proved useful for correlating with a number of perovskite properties.[25,47-49] The B-site cation 3d-band center and the La/Sr A-site band centers (both calculated with respect to $E_{Fermi}$) were also investigated as possible descriptors. However, no useful physical trends emerged from those analyses.

Figure 4A:
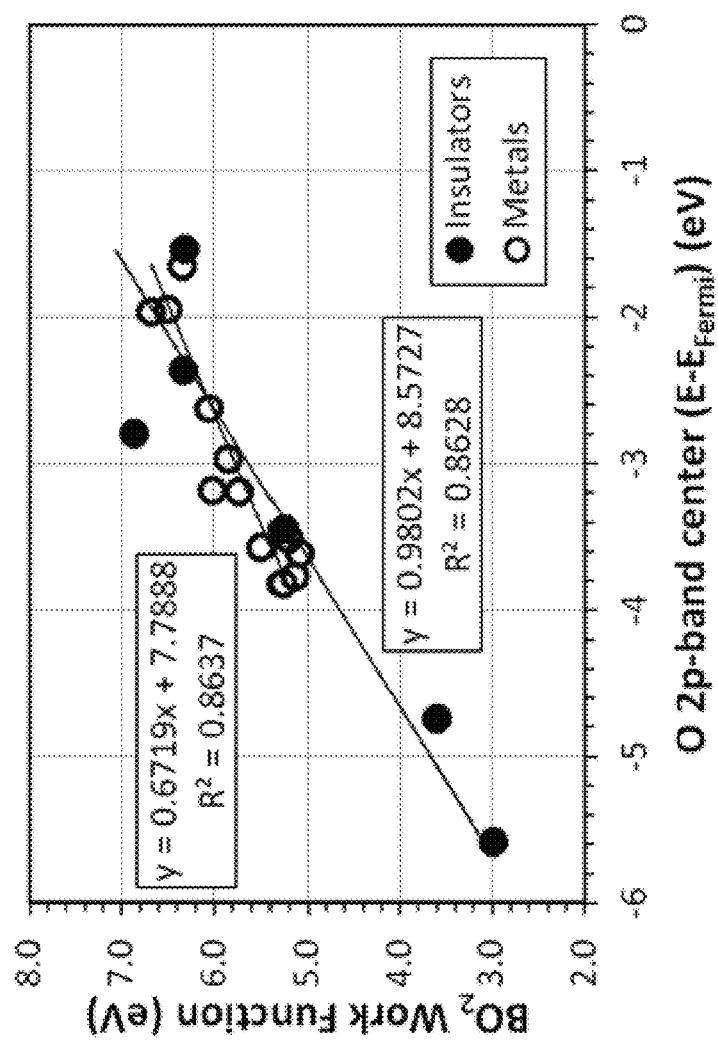
FIGS. 4A-4B show plots of calculated work functions for the $BO_2$ (FIG. 4A) and AO-terminated surfaces (FIG. 4B) of $ABO_3$ materials as a function of the O 2p band center of bulk $ABO_3$ materials. In both plots, the filled circles represent insulating perovskites while the open circles represent metallic perovskites.
Figure 4B:
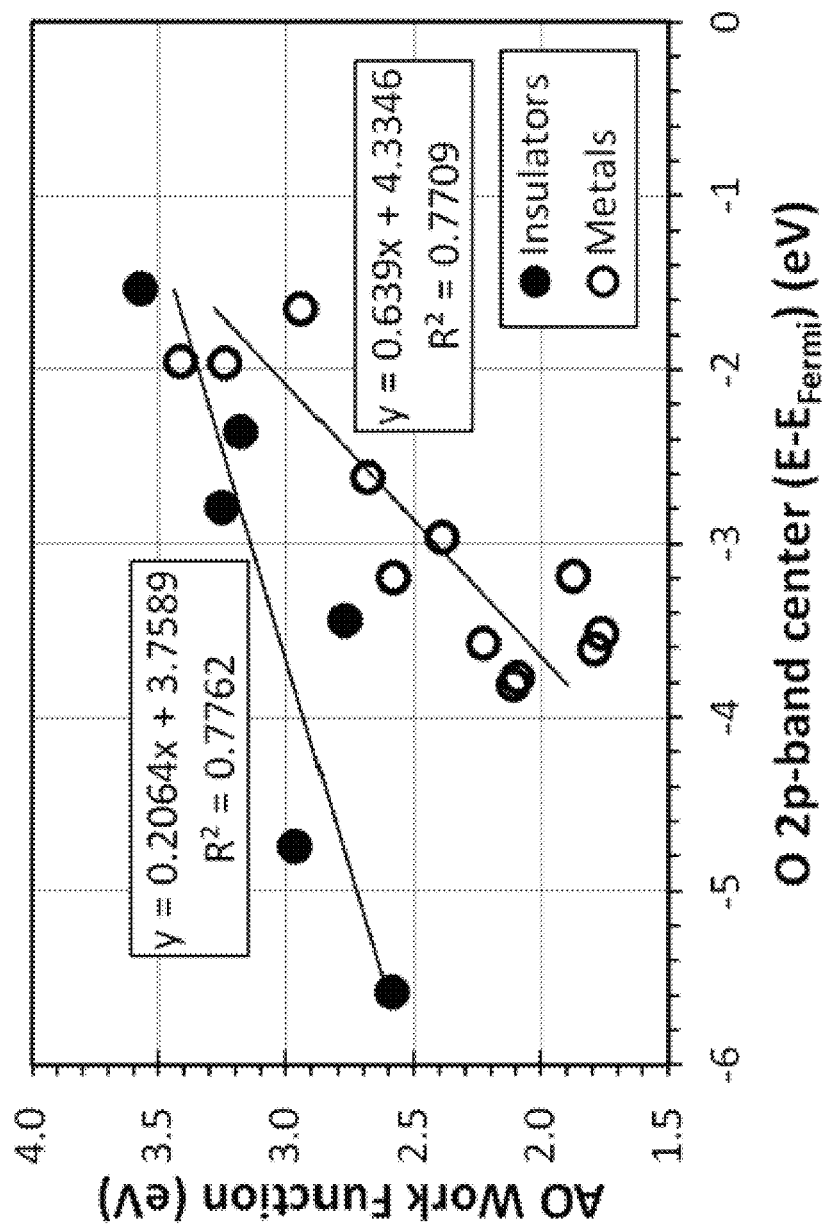

FIGS. 4A-4B demonstrate the relationship between the calculated (001) work functions and the value of the bulk O 2p-band center. FIG. 4A (FIG. 4B) is a plot of $BO_2$ work function (AO work function) as a function of the O 2p-band center energy. In both plots, the filled circles refer to insulating perovskites while open circles refer to metallic perovskites. In the present case, "insulating" refers to any material calculated to have a finite bulk and surface band gap, whether due to band-insulating or Mott-Hubbard insulating behavior. The materials which compose the set of insulating perovskites are: $LaScO_3$, $LaTiO_3$, $LaVO_3$, $LaCrO_3$, $SrTiO_3$ and $LaAlO_3$. The twelve remaining perovskite materials are referred to as "metallic" perovskites. Although the bulk ground states of some of these materials, for example $LaMnO_3$ and $LaFeO_3$, are also insulating in a formal sense, the ferromagnetic near-surface electronic structure is metallic.[35] Therefore, the inclusion of $LaMnO_3$ and $LaFeO_3$ in the category of "metallic" perovskites is not arbitrary, as these materials demonstrate fundamentally different electronic structure behavior than prototypical Mott-Hubbard insulators such as $LaTiO_3$ and $LaVO_3$ near the surface.

Both plots of FIGS. 4A-4B show a linear trend of the calculated work function versus the bulk O 2p band center, although the trend is more consistently linear in the case of $BO_2$ work functions. In general, these results demonstrate that the bulk O 2p band center provides an approximate quantitative predictor of the work function. Interestingly, in FIG. 4A, the slope of the $BO_2$ work function versus O 2p band center is approximately 1, while in FIG. 4B the slope of the AO work function is approximately 0.25-0.5. This result demonstrates that the $BO_2$ work function change is dominated by the energy difference between the O 2p band center and $E_{Fermi}$, which is changing as a result of the filling of the B 3d bands with B-site composition. This result therefore demonstrates that the surface dipole effects are largely constant in determining the $BO_2$ work function. In the case of the AO work functions, where the work function doesn't change in direct proportion to the movement of the O 2p band center, changing surface dipoles clearly play a much larger role in determining the work function.

From the above discussions the understanding of the trend in O 2p band with the work function may be summarized as follows: The location of the O 2p band is, within a few tenths of an eV, fixed relative to the vacuum level, and its energy relative to $E_{Fermi}$ is highly dependent on the number of 3d electrons in the system and the bond hybridization (ionicity) between the B 3d levels and O 2p levels. When proceeding from Ti through Ni and adding more 3d electrons to the system, the bond hybridization increases, the 3d bands fill and move lower in energy, and thus $E_{Fermi}$ is lower in energy and closer to the (approximately fixed relative to vacuum) O 2p band center. Since $E_{Fermi}$ is lower in energy, the work function of $BO_2$ surfaces increases as more 3d electrons are added. Furthermore, for the same B-site transition metal element, if the B-site is more oxidized (e.g. comparing $Co^{3+}$ in $LaCoO_3$ with $Co^{4+}$ in $SrCoO_3$), the material containing the more oxidized transition metal will exhibit greater hybridization between the B 3d and O 2p bands, thus resulting in higher work functions. From Table 1 and FIG. 2, it can be seen that all $SrBO_3$ materials have higher work functions than their analogous $LaBO_3$ materials, except for AO-terminated $SrVO_3$. These hybridization trends with 3d electron filling are consistent with experimental and computational findings of Suntivich and coworkers.[42] Broadly, the band structure progression shown in FIGS. 3A-3C is a close representation of how the $BO_2$ work function changes with composition and 3d band filling. In the case of the AO work function, the physics of FIGS. 3A-3C certainly plays a role, but as the slopes of work function versus O 2p band center in FIG. 4B are not close to one, the remaining portion of the work function change is due to surface dipoles, as discussed in "$ABO_3$ calculated work functions."

$SrVO_3$ as a Low Work Function, Metallic Perovskite.

The earlier analysis in "Work function trends: band perspective" has demonstrated that of the 18 perovskite materials considered here, $SrVO_3$ has an extremely low work function, rendering it particularly useful for electron emitting applications, e.g., for high power electron beam devices used in defense, scientific research and communications and as an electron-emitting layer in the renewable energy technology of photon-enhanced thermionic energy conversion devices. The metallic perovskite $SrVO_3$ has been successfully synthesized both as a bulk polycrystalline powder[43, 44] and as a controlled (001)-oriented thin film grown with MBE.[45] $SrVO_3$ possesses a very high conductivity of about $10^5$ $\Omega^{-1}cm^{-1}$ at room temperature, higher than $SrRuO_3$ (a prototypical metallic perovskite) and on par with elemental metals such as Pt.[45] $SrVO_3$ maintains its structural stability even up to high temperatures of 1300° C. and under reducing conditions during annealing with an $H_2/N_2$ or $H_2/Ar$ gas atmosphere.[43,44,46] Moreover, there are opportunities with doping $SrVO_3$ to lower its work function further. In this section, alkaline earth metal doping in $SrVO_3$ is considered. Also considered are the pristine (011) and (111) surface terminations to ascertain the full work function range of $SrVO_3$ and also obtain a more quantitative understanding of which surface terminations should be stable (and thus present in the highest quantity) in a real device. In addition, the effect of surface segregation in $SrVO_3$ is considered.

Figures 5A, 5B, 5C:
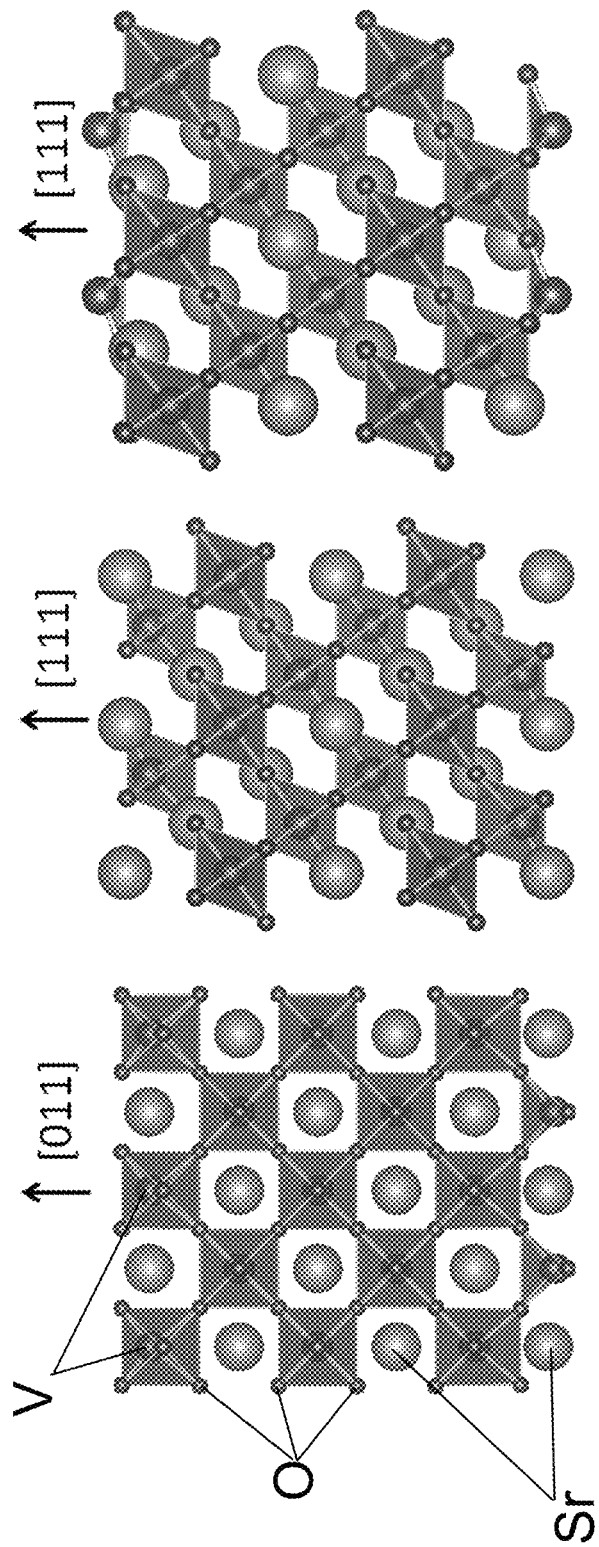
FIGS. 5A-5C show $SrVO_3$ surface slabs of (011) and (111) orientations.

FIGS. 5A-5C illustrates the surface structures of (011) and (111) terminated $SrVO_3$. From FIG. 5A, the (011) termination can either be O-terminated or ABO-terminated. FIGS. 5B and 5C show symmetric (111) surfaces that are B-terminated (FIG. 5B) and $AO_3$-terminated (FIG. 5C). The work functions and surface energies for these surface terminations (as well as surface energies for (001) surfaces) were calculated and are tabulated below in Table 2.

TABLE 2

Tabulated values of calculated work functions and surface energies for different SrVO$_3$ surface terminations. The work functions of (001) surfaces are repeated from Table 1 for clarity.

| Termination | Work Function (eV) | Surface Energy (eV/Å$^2$) |
|---|---|---|
| (001) | 1.86 (AO), 5.09 (BO$_2$) | 0.052 (AO/BO$_2$ average) |
| (011) | 2.32 (ABO), 7.23 (O) | 0.094 (O/ABO average) |
| (111) | 2.78 (B), 4.68 (AO$_3$) | 0.078 (B/AO$_3$ average) |

From Table 2, it can be seen that the pristine (001) surfaces have a lower surface energy and thus are more stable than (011) and (111) surfaces, consistent with previous DFT studies.[27,28] Recent experimental LEIS measurements show that numerous perovskite materials have dominant (001) surface terminations that are most likely AO-terminated.[29,30,50] From the current calculations, overall order of stability is: $\gamma(001) < \gamma(111) < \gamma(011)$. The ABO-terminated (011) surface has a reasonably low work function of 2.32 eV, but overall the (011) and (111) surfaces possess higher work functions than AO-terminated (001). The fact that the (001) terminations of SrVO$_3$ are predicted to be the stable terminations, together with the fact that AO-terminated (001) SrVO$_3$ exhibits the lowest work function of the surfaces explored here further reinforces SrVO$_3$ as a new low work function material.

Next, the effect of doping the alkaline earth metals Mg, Ca and Ba in SrVO$_3$ was examined. From FIG. 2, it was suggested from comparing the work function values of SrFeO$_3$, SrCoO$_3$, and BSCF that doping Ba onto the A-site of Sr-based perovskites may result in a lowering of the work function. Here, the focus is solely on the AO-terminated (001) surface of SrVO$_3$ since this is the low work function surface termination of interest. The AO-terminated (001) surface was simulated with concentrations of 25%, 50% and 100% site fraction Mg, Ca and Ba (equivalent to replacing one SrO row with a (Mg, Ca, Ba)O row) on the surface of the AO (001) slab (see FIG. 6C). It was found that surface doping of Mg and Ca raised the work function for all concentrations, while doping Ba lowered the work function for all concentrations. In particular, a site fraction of 100% Ba on the surface resulted in a very low work function of just 1.07 eV.

To better understand the role of Ba doping in lowering the work function (i.e. bulk doping versus surface dipole formation), also simulated was a full layer of BaO in place of SrO in the middle of the AO (001) slab. It was found that placement of Ba in the middle of the slab resulted in a barely increased work function of 1.90 eV, which is 0.04 eV higher than pure SrVO$_3$. However, placement of the Ba in the top surface layer resulted in a profound lowering of the work function down to 1.07 eV, which is 0.79 eV lower than pure SrVO$_3$. This indicates that the work function lowering from Ba doping is due entirely to altering the surface dipole. By comparing the atomic positions of a pristine SrVO$_3$ surface and SrVO$_3$ with Ba in the surface layer, it is clear that the bond lengths between Ba and sub-surface O (the O in the BO$_2$ layer beneath the surface) is about 0.2 Å longer than the bond length between Sr and the same sub-surface O. This longer bond length is most likely the result of the larger ionic radius of Ba (1.75 Å) over Sr (1.58 Å). [51] This bond lengthening increases the size of the dipole for Ba at the surface in a direction that lowers the work function compared to Sr, and this bond stretching is likely a major reason for the work function change with Ba doping. The work function reduction of 0.79 eV amounts to a surface dipole change of approximately 0.26 eV-Å with the addition of a full Ba surface layer, and can be obtained directly from VASP simulations and is also calculable using the Helmholtz equation.[1,2]

Because Ba$^{2+}$ is a larger cation than Sr$^{2+}$, it was worth investigating whether cation segregation may occur in doped SrVO$_3$. As discussed previously, cation segregation has been observed in many perovskite materials.[27,31-34,51-54] To ascertain if Ba segregation may occur in SrVO$_3$, the formation energy of substituting Ba in place of Sr was calculated for the two cases illustrated in FIGS. 6A-6B, and also calculated was the segregation energy of dilute Ba (25% Ba substitution in the middle of the surface slab) to the surface of SrVO$_3$. The energy to substitute Sr for Ba, $\Delta E_{sub}$, was calculated using the equation $\Delta E_{sub} = E_{defected} - E_{perfect} - x(E_{BaO} - E_{SrO})$ where $E_{defected}$ is the total energy of the SrVO$_3$ surface slab with Ba substituting for Sr, $E_{perfect}$ is the energy of the undefected SrVO$_3$ slab, x is the number of Ba substitutions (in this case x=1 Ba atom in the dilute calculation), and $E_{BaO}$ and $E_{SrO}$ are the total energies of rocksalt BaO and rocksalt SrO, respectively, which are taken as the reference states for Ba and Sr atoms. It was found that the energy to substitute Ba for Sr in the middle of the SrVO$_3$ slab (FIG. 6A) was 0.26 eV/Ba, while to substitute Ba for Sr on the surface (FIG. 6B) was −0.38 eV/Ba. The energetic driving force for Ba surface segregation is just the difference of these energies, and is equal to −0.64 eV/Ba. Note that while the value of $\Delta E_{sub}$ is, in principle, dependent on temperature, pressure, and choice of reference state, the energy difference reported by calculating the segregation energy is the more physically insightful quantity, and its value is independent of the chosen reference state. The magnitude of this segregation energy is consistent with DFT calculations of cation surface segregation in other systems. [55] Therefore, if Ba is doped into SrVO$_3$, over time Ba will diffuse to the surface and will dramatically lower the value of the work function. Analogous calculations for Mg and Ca doping indicate there is essentially no driving force (−0.07 eV/atom for Mg, −0.05 eV/atom for Ca) to segregate these species to the SrVO$_3$ surface compared to the Ba case. A combined experimental and DFT study of Ca, Sr, and Ba doping in (La, Sm)MnO$_3$ has suggested that cation segregation is a combination of both elastic (via lattice strain of mismatched cation sizes) and electrostatic effects attributed to the differing valences of alkaline earth and lanthanide elements as well as interaction with charged defects in doped LaMnO$_3$.[54] In the case of alkaline earth doping in SrVO$_3$ the predicted Ba cation segregation is presumably due primarily to lattice strain, as Mg, Ca, Sr and Ba are all 2+ cations and no charged defects or vacancies have been considered.

An important consideration of Ba doping in SrVO$_3$ is whether or not the surface-segregated Ba atoms are stable on the surface. To investigate this possibility, the adsorption energy of the Ba—O species present on the surface was calculated relative to bulk rocksalt BaO using standard GGA-based DFT methods for three cases: ¼ monolayer Ba—O coverage on W(001) following Ref [1], ⅞ monolayer Ba—O coverage on Sc$_2$O$_3$(011) following Ref. [2], and the present case of 1 monolayer Ba—O coverage on SrVO$_3$ (001). These materials were chosen for comparison with SrVO$_3$ because W(001) with BaO is the dominant emitting surface of typical commercial thermionic cathode devices and Sc$_2$O$_3$(011) with BaO was found to be the most likely candidate for low work function surfaces in scandate cathode devices.[1,2] It was found that the adsorption energy (per Ba—O formula unit) for W(001), $Sc_2O_3$(011) and $SrVO_3$(001) are: 0.71 eV/Ba, −0.27 eV/Ba and −1.19 eV/Ba, respectively. Since the time to desorb an atom from a material surface scales exponentially with the adsorption energy, it is evident from the above calculations that at T=1000 K, which is an approximate temperature used in thermionic emission devices, Ba will reside on the $SrVO_3$ (001) surface approximately 5 orders of magnitude longer than on $Sc_2O_3$(011), and approximately 9 orders of magnitude longer than on W(001). Overall, the surface-segregated Ba atoms in $SrVO_3$ are much more strongly bonded to the $SrVO_3$ surface than the volatile Ba—O surface dipole layers present in W- and $Sc_2O_3$-based electron sources. Thus, $SrVO_3$ can provide an electron emission source that simultaneously exhibits an ultra-low work function of 1.07 eV and an operating lifetime orders of magnitude longer than current dispenser cathode technologies.

The O 2p band center provides a way to predict the work function of either the AO- or $BO_2$-terminated surface from strictly a bulk materials property. In general, surface supercell calculations are quite computationally expensive (especially with HSE functionals), while bulk calculations are many times faster as a result of fewer atoms per supercell and higher supercell symmetry. Thus, the correlation between bulk O 2p band center and surface work function will enable fast, bulk materials screening of the O 2p band center to predict work function values of perovskite alloys. Calculation of the bulk O 2p band center is roughly a factor of 25 times faster than calculating the work function (a factor of 50 considering both the AO- and $BO_2$-terminated surfaces), and thus provides a useful estimate of a perovskite work function with comparatively minimal computational time. By high-throughput calculation of perovskite band gaps and O 2p band centers it is possible to screen for low work function materials.[56-58] In particular, materials that meet the conditions of zero (or near-zero) band gap and low O 2p band center will be desirable. By way of illustration, preliminary high-throughput DFT screening using GGA+U has indicated that perovskites within the family of (La, Pr, Y)(Ti, V)$O_3$ and $SrVO_3$ have deep O 2p band centers and a partially filled 3d band. Further A-site alloying of alkaline earths and B-site alloying with other transition metals within this low O 2p band composition space can yield smaller (or zero) bandgap materials.

CONCLUSIONS

Work function values for perovskites are useful as they provide an absolute energy band alignment of these materials versus the well-defined vacuum reference energy level. This information is essential for applications involving electron transport at interfaces or surfaces, including solar cells, electrocatalysts, conducting oxide electronics, Schottky barriers, vacuum electron emitters and thermionic energy conversion technologies. In this Example, HSE functional DFT work function calculations were performed for the AO- and $BO_2$-terminated (001) surfaces for 18 perovskite systems: the LaBO$_3$ materials, where B=Sc, Ti, V, Cr, Mn, Fe, Co, Ni; the SrBO$_3$ materials, where B=Ti, V, Fe, Co; the $La_{1-x}Sr_xMnO_3$ materials (x=0.0625, 0.125, 0.25, 0.375), $LaAlO_3$ and $Ba_{0.5}Sr_{0.5}Co_{0.75}Fe_{0.25}O_3$ materials. The work function range of these materials was determined and the physics which governs the value of the work function was identified and understood. Overall, the AO-terminated surfaces exhibited low work functions while $BO_2$-terminated surfaces exhibited high work functions. The work function range of these materials was broad, and varies from as low as 1.76 eV for AO-terminated $LaMnO_3$ and 1.86 eV for AO-terminated $SrVO_3$ to 6.87 eV for $BO_2$-terminated $LaAlO_3$.

The O 2p band center of the bulk materials was used as an electronic structure descriptor to develop an understanding of the work function physics. It was found that, in general, materials containing more 3d electrons have occupied B 3d bands that are lower in energy. As a result, there is a larger degree of hybridization between the B 3d and O 2p bands, and the position of the O 2p bands become closer to $E_{Fermi}$. The filling of the B 3d band and subsequent increased hybridization causes $E_{Fermi}$ to become deeper in energy with respect to the vacuum level, and the surface work function trends therefore follow those of the O 2p band center. We found that there is an approximately linear correlation between both the AO and $BO_2$ work functions and the value of the O 2p band center of the corresponding bulk materials. Interestingly, the slope of the $BO_2$ work function versus O 2p band center is approximately one, indicating the change in $BO_2$ work function with composition is dominated by the shifting of the O 2p bands with respect to $E_{Fermi}$ and hybridization as a result of 3d band filling. This result demonstrates that the surface dipole for electrons leaving the $BO_2$ surfaces is nearly constant (within a few tenths of an eV) across all the systems. The nearly constant surface dipole for $BO_2$ surfaces can be rationalized because the electronic states near $E_{Fermi}$ are dominated by a mixture of B 3d and O 2p states. These electrons are directly present at the terminating $BO_2$ surface and do not have to move through a large additional dipole layer to emit into vacuum. On the other hand, the work function of the AO surfaces can be thought of as taking an electron from the $BO_2$ surface and moving it through an additional surface dipole, which is the terminating AO surface layer. Because the AO work functions show a relatively flat trend (within approximately 1 eV) with B-site composition and a slope of much less than one with the O 2p bands, it was determined that the AO surface dipole magnitude increases with B 3d band filling and bond hybridization. The ability to predict the value of a surface quantity such as the work function from just a bulk materials property like the O 2p band center provides the opportunity for fast, high-throughput screening of perovskite compounds for materials with desired magnitude of work function.

Electron-emission cathode materials find application in high power electron beam devices used in defense, scientific research and communications applications and in thermionic energy conversion technologies. Electron emitters suitable as an electron source desirably exhibit a low work function, stability in conditions of high temperature and low pressure, and sufficient conductivity to sustain the desired emission current. As compared to scandate and other thermionic cathodes, perovskites possess natively polar surfaces; as such, an additional volatile adsorbed dipole layer is not necessary to realize a low work function. $SrVO_3$ was found to meet the above criteria, exhibiting one of the lowest calculated work function of the materials considered here, equal to 1.86 eV for the AO-terminated (001) surface. Additional work function calculations for (011)-oriented surfaces terminated by both O and ABO surfaces and (111)-oriented surfaces terminated by both B and $AO_3$ surfaces were performed. It was found that these surfaces all possessed higher work functions than the AO-terminated (001) surfaces. However, the (001)-oriented $SrVO_3$ surfaces were the most stable of those considered. On thermodynamic grounds, low work function (001)-surfaces should dominate in quantity over other surface terminations in real devices.

The last portion of the investigation of SrVO$_3$ involved Ba doping to further lower the work function. By comparing the effect of doping Ba into the middle of the surface slab versus in the terminating surface layer, it was found that while doping Ba into the middle of the slab barely raised the AO-terminated work function to 1.90 eV, doping Ba into the top surface layer resulted in a very low work function of only 1.07 eV. In addition, it was discovered that there was a tendency of Ba to segregate to the surface of SrVO$_3$, with a segregation energy of −0.64 eV/Ba. The Ba cation segregation is presumably the result of the larger Ba$^{2+}$ cation creating a lattice strain which is relieved by having Ba occupy the surface rather than bulk lattice sites. Lastly, it was determined that the Ba adsorption energy of Ba—O on SrVO$_3$ was more stable than Ba—O adsorption on W(001) and Sc$_2$O$_3$(011) surfaces, indicating that Ba will reside on the SrVO$_3$ surface orders of magnitude longer than on other widely explored thermionic cathode material surfaces.

Example 2

In this example, the methods described in Example 1, above, were used to analyze the transition metal perovskite oxide BaNbO$_3$. The work function of this material was found to be 1.5 eV.

REFERENCES (1) V. Vlahos, J. H. Booske and D. Morgan. Ab Initio Investigation of Barium-Scandium-Oxygen Coatings on Tungsten for Electron Emitting Cathodes, *Physical Review B*, 2010, 81, 054207-1-15.
(2) R. M. Jacobs, J. H. Booske and D. Morgan. Electron Emission Energy Barriers and Stability of Sc$_2$O$_3$ with Adsorbed Ba and Ba—O, *The Journal of Physical Chemistry C*, 2014, 118, 19742-19758.
(3) P. M. Zagwijn, J. W. M. Frenken, U. van Slooten and P. A. Duine. A Model System for Scandate Cathodes, *Applied Surface Science*, 1997, 111, 35-41.
(4) J. H. Booske. Plasma Physics and Related Challenges of Millimeter-Wave-to-Terahertz and High Power Microwave Generation, *Physics of Plasmas*, 2008, 15, 055502-1-16.
(5) A. S. Gilmour, *Principles of Traveling Wave Tubes*. 1994, Norwood, Mass.: Artech House.
(6) J. W. Schwede, I. Bargatin, D. C. Riley, B. E. Hardin, S. J. Rosenthal, Y. Sun, F. Schmitt, P. Pianetta, R. T. Howe, Z.-X. Shen and N. A. Melosh. Photon-enhanced thermionic emission for solar concentrator systems, *Nature Materials*, 2010, 9, 762-767.
(7) J. W. Schwede, T. Sarmiento, V. K. Narasimhan, S. J. Rosenthal, D. C. Riley, F. Schmitt, I. Bargatin, K. Sahasrabuddhe, R. T. Howe, J. S. Harris, N. A. Melosh and Z. X. Shen. Photon-enhanced thermionic emission from heterostructures with low interface recombination, *Nature Communications*, 2013, 4, 1576.
(8) G. Kresse and J. Furthmuller. Efficient Iterative Schemes for Ab Initio Total-Energy Calculations using a Planewave Basis Set, *Physical Review B*, 1996, 54, 11169-11186.
(9) J. Heyd, G. E. Scuseria and M. Ernzerhof. Hybrid Functionals Based on a Screened Coulomb Potential, *The Journal of Chemical Physics*, 2003, 118, 8207-8215.
(10) J. P. Perdew, K. Burke and M. Ernzerhof. Generalized Gradient Approximation Made Simple, *Physical Review Letters*, 1996, 77, 3865-3868.
(11) G. Kresse and D. Joubert. From Ultrasoft Pseudopotentials to the Projector Augmented-Wave Method, *Physical Review B*, 1999, 59, 1758-1775.
(12) J. He and C. Franchini. Screened hybrid functional applied to 3d$^0$-3d$^8$ transition-metal perovskites LaMO$_3$ (M=Sc—Cu): Influence of the exchange mixing parameter on the structural, electronic, and magnetic properties, *Physical Review B*, 2012, 86, 235117.
(13) F. Cesare. Hybrid functionals applied to perovskites, *Journal of Physics: Condensed Matter*, 2014, 26, 253202.
(14) R. Wahl, D. Vogtenhuber and G. Kresse. SrTiO$_3$ and BaTiO$_3$ revisited using the projector augmented wave method: Performance of hybrid and semilocal functionals, *Physical Review B*, 2008, 78, 104116.
(15) M. Choi, F. Oba, Y. Kumagai and I. Tanaka. Antiferrodistortive-Like Oxygen-Octahedron Rotation Induced by the Oxygen Vacancy in Cubic SrTiO$_3$, *Advanced Materials*, 2013, 25, 86-90.
(16) D. H. Seo, A. Urban and G. Ceder. Calibrating transition metal energy levels and oxygen bands in first principles calculations: accurate prediction of redox potentials and charge transfer in lithium transition metal oxides, *arXiv preprint arXiv*: 1507.08768, 2015.
(17) H. J. Monkhorst and J. D. Pack. Special Points for Brillouin-Zone Integrations, *Physical Review B*, 1976, 13, 5188-5192.
(18) J. Suntivich, H. A. Gasteiger, N. Yabuuchi, H. Nakanishi, J. B. Goodenough and Y. Shao-Horn. Design principles for oxygen-reduction activity on perovskite oxide catalysts for fuel cells and metal-air batteries, *Nat Chem*, 2011, 3, 546-550.
(19) Z. Shao, W. Yang, Y. Cong, H. Dong, J. Tong and G. Xiong. Investigation of the permeation behavior and stability of a Ba$_{0.5}$Sr$_{0.5}$Co$_{0.8}$Fe$_{0.2}$O$_{3-\delta}$ oxygen membrane, *Journal of Membrane Science*, 2000, 172, 177-188.
(20) V. V. Kharton, A. V. Kovalevsky, A. P. Viskup, F. M. Figueiredo, A. A. Yaremchenko, E. N. Naumovich and F. M. B. Marques. Oxygen Permeability of Ce$_{0.8}$Gd$_{0.2}$O$_{2-\delta}$—La$_{0.7}$Sr$_{0.3}$MnO$_{3-\delta}$ Composite Membranes, *Journal of The Electrochemical Society*, 2000, 147, 2814-2821.
(21) Y.-L. Lee, J. Kleis, J. Rossmeisl and D. Morgan. Ab Initio Energetics of LaBO$_3$ (001) (B=Mn, Fe, Co, and Ni) for Solid Oxide Fuel Cell Cathodes, *Physical Review B*, 2009, 80, 224101-1-20.
(22) J. S. Zhou and J. B. Goodenough. Paramagnetic phase in single-crystal LaMnO$_3$, *Physical Review B*, 1999, 60, R15002-R15004.
(23) J. B. Goodenough and P. M. Raccah. Complex vs Band Formation in Perovskite Oxides, *Journal of Applied Physics*, 1965, 36, 1031-1032.
(24) M. Gadre. Ph.D. Thesis. University of Wisconsin-Madison. http://gradworks.umi.com/36/86/3686712.html.2014.
(25) W. T. Hong, M. Gadre, Y.-L. Lee, M. D. Biegalski, H. M. Christen, D. Morgan and Y. Shao-Horn. Tuning the Spin State in LaCoO$_3$ Thin Films for Enhanced High-Temperature Oxygen Electrocatalysis, *The Journal of Physical Chemistry Letters*, 2013, 4, 2493-2499.
(26) S. K. Pandey, A. Kumar, S. Patil, V. R. R. Medicherla, R. S. Singh, K. Maiti, D. Prabhakaran, A. T. Boothroyd and A. V. Pimpale. Investigation of the spin state of Co in LaCoO$_3$ at room temperature: Ab initio calculations and high-resolution photoemission spectroscopy of single crystals, *Physical Review B*, 2008, 77, 045123.

(27) H. Ding, A. V. Virkar, M. Liu and F. Liu. Suppression of Sr surface segregation in $La_{1-x}Sr_xCo_{1-y}Fe_yO_{3-\delta}$: a first principles study, *Physical Chemistry Chemical Physics,* 2013, 15, 489-496.

(28) Y. Choi, D. S. Mebane, M. C. Lin and M. Liu. Oxygen Reduction on $LaMnO_3$-Based Cathode Materials in Solid Oxide Fuel Cells, *Chemistry of Materials,* 2007, 19, 1690-1699.

(29) J. Kilner, S. Skinner and H. Brongersma. The isotope exchange depth profiling (IEDP) technique using SIMS and LEIS, *Journal of Solid State Electrochemistry,* 2011, 15, 861-876.

(30) J. Druce, H. Tellez, M. Burriel, M. D. Sharp, L. J. Fawcett, S. N. Cook, D. S. McPhail, T. Ishihara, H. H. Brongersma and J. A. Kilner. Surface termination and subsurface restructuring of perovskite-based solid oxide electrode materials, *Energy & Environmental Science,* 2014.

(31) Z. Cai, Y. Kuru, J. W. Han, Y. Chen and B. Yildiz. Surface Electronic Structure Transitions at High Temperature on Perovskite Oxides: The Case of Strained $La_{0.8}Sr_{0.2}CoO_3$ Thin Films, *Journal of the American Chemical Society,* 2011, 133, 17696-17704.

(32) Z. Feng, Y. Yacoby, W. T. Hong, H. Zhou, M. D. Biegalski, H. M. Christen and Y. Shao-Horn. Revealing the atomic structure and strontium distribution in nanometer-thick $La_{0.8}Sr_{0.2}CoO_{3-\delta}$ grown on (001)-oriented $SrTiO_3$, *Energy & Environmental Science,* 2014, 7, 1166-1174.

(33) J. Druce, T. Ishihara and J. Kilner. Surface composition of perovskite-type materials studied by Low Energy Ion Scattering (LEIS), *Solid State Ionics,* 2014, 262, 893-896.

(34) M. Burriel, S. Wilkins, J. P. Hill, M. A. Munoz-Marquez, H. H. Brongersma, J. A. Kilner, M. P. Ryan and S. J. Skinner. Absence of Ni on the outer surface of Sr doped $La_2NiO_4$ single crystals, *Energy & Environmental Science,* 2014, 7, 311-316.

(35) Y.-L. Lee and D. Morgan. Ab initio defect energetics of perovskite (001) surfaces for solid oxide fuel cells: A comparative study of $LaMnO_3$ versus $SrTiO_3$ and $LaAlO_3$, *Physical Review B,* 2015, 91, 195430.

(36) T. T. Fister, D. D. Fong, J. A. Eastman, P. M. Baldo, M. J. Highland, P. H. Fuoss, K. R. Balasubramaniam, J. C. Meador and P. A. Salvador. In situ characterization of strontium surface segregation in epitaxial La0.7Sr0.3MnO3 thin films as a function of oxygen partial pressure, *Applied Physics Letters,* 2008, 93, 151904.

(37) N. Nakagawa, H. Y. Hwang and D. A. Muller. Why some interfaces cannot be sharp, *Nat Mater,* 2006, 5, 204-209.

(38) C. Noguera and J. Goniakowski. Polarity in Oxide Nano-objects, *Chemical Reviews,* 2012.

(39) W. Monch, *Semiconductor Surfaces and Interfaces.* 3rd ed. 2001, Berlin: Springer.

(40) W. Tang, E. Sanville and G. Henkelman. A grid-based Bader analysis algorithm without lattice bias, *Journal of Physics: Condensed Matter,* 2009, 21, 084204.

(41) G. Henkelman, A. Arnaldsson and H. Jónsson. A fast and robust algorithm for Bader decomposition of charge density, *Computational Materials Science,* 2006, 36, 354-360.

(42) J. Suntivich, W. T. Hong, Y.-L. Lee, J. M. Rondinelli, W. Yang, J. B. Goodenough, B. Dabrowski, J. W. Freeland and Y. Shao-Horn. Estimating Hybridization of Transition Metal and Oxygen States in Perovskites from O K-edge X-ray Absorption Spectroscopy, *The Journal of Physical Chemistry C,* 2014, 118, 1856-1863.

(43) T. Maekawa, K. Kurosaki and S. Yamanaka. Physical properties of polycrystalline $SrVO_{3-\delta}$, *Journal of Alloys and Compounds,* 2006, 426, 46-50.

(44) M. Onoda, H. Ohta and H. Nagasawa. Metallic properties of perovskite oxide $SrVO_3$, *Solid State Communications,* 1991, 79, 281-285.

(45) J. A. Moyer, C. Eaton and R. Engel-Herbert. Highly Conductive $SrVO_3$ as a Bottom Electrode for Functional Perovskite Oxides, *Advanced Materials,* 2013, 25, 3578-3582.

(46) S. Hui and A. Petric. Conductivity and stability of $SrVO_3$ and mixed perovskites at low oxygen partial pressures, *Solid State Ionics,* 2001, 143, 275-283.

(47) Y.-L. Lee, J. Kleis, J. Rossmeisl, Y. Shao-Horn and D. Morgan. Prediction of solid oxide fuel cell cathode activity with first-principles descriptors, *Energy & Environmental Science,* 2011, 4, 3966-3970.

(48) A. Grimaud, K. J. May, C. E. Carlton, Y.-L. Lee, M. Risch, W. T. Hong, J. Zhou and Y. Shao-Horn. Double perovskites as a family of highly active catalysts for oxygen evolution in alkaline solution, *Nat Commun,* 2013, 4.

(49) W. T. Hong, M. Risch, K. A. Stoerzinger, A. Grimaud, J. Suntivich and Y. Shao-Horn. Toward the rational design of non-precious transition metal oxides for oxygen electrocatalysis, *Energy & Environmental Science,* 2015.

(50) I. C. Fullarton, J. P. Jacobs, H. E. van Benthem, J. A. Kilner, H. H. Brongersma, P. J. Scanlon and B. C. H. Steele. Study of oxygen ion transport in acceptor doped samarium cobalt oxide, *Ionics,* 1995, 1, 51-58.

(51) R. Shannon. Revised effective ionic radii and systematic studies of interatomic distances in halides and chalcogenides, *Acta Crystallographica Section A,* 1976, 32, 751-767.

(52) Z. Cai, M. Kubicek, J. Fleig and B. Yildiz. Chemical Heterogeneities on $La_{0.6}Sr_{0.4}CoO_{3-\delta}$ Thin Films—Correlations to Cathode Surface Activity and Stability, *Chemistry of Materials,* 2012, 24, 1116-1127.

(53) Y. Orikasa, E. J. Crumlin, S. Sako, K. Amezawa, T. Uruga, M. D. Biegalski, H. M. Christen, Y. Uchimoto and Y. Shao-Horn. Surface Strontium Segregation of Solid Oxide Fuel Cell Cathodes Proved by In Situ Depth-Resolved X-ray Absorption Spectroscopy, *ECS Electrochemistry Letters,* 2014, 3, F23-F26.

(54) W. Lee, J. W. Han, Y. Chen, Z. Cai and B. Yildiz. Cation Size Mismatch and Charge Interactions Drive Dopant Segregation at the Surfaces of Manganite Perovskites, *Journal of the American Chemical Society,* 2013, 135, 7909-7925.

(55) M. J. Gadre, Y.-L. Lee and D. Morgan. Cation interdiffusion model for enhanced oxygen kinetics at oxide heterostructure interfaces, *Physical Chemistry Chemical Physics,* 2012, 14, 2606-2616.

(56) S. Curtarolo, G. L. W. Hart, M. B. Nardelli, N. Mingo, S. Sanvito and O. Levy. The high-throughput highway to computational materials design, *Nat Mater,* 2013, 12, 191-201.

(57) A. Jain, G. Hautier, C. J. Moore, S. Ping Ong, C. C. Fischer, T. Mueller, K. A. Persson and G. Ceder. A high-throughput infrastructure for density functional theory calculations, *Computational Materials Science,* 2011, 50, 2295-2310.

(58) T. Angsten, T. Mayeshiba, H. Wu and D. Morgan. Elemental vacancy diffusion database from high-throughput first-principles calculations for fcc and hcp structures, *New Journal of Physics*, 2014, 16, 015018.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An electron emitter device comprising:
   a cathode comprising a conductive transition metal perovskite oxide comprising mobile conducting electrons exhibiting a conductivity of at least $10^{-6}$ $\Omega^{-1}$-cm$^{-1}$ at room temperature, the transition metal perovskite oxide having a surface from which the mobile electrons are induced to emit upon receiving sufficient energy from an energy source; and
   an anode electrically coupled to the cathode and positioned to define an interelectrode conductive region between the anode and the cathode, onto which anode the emitted electrons are collected, wherein the transition metal perovskite oxide does not have the formula $(La,Ba,Sr)TiO_3$.

2. The electron emitter device of claim 1, further comprising an enclosure configured to enclose the cathode, the anode and the interelectrode conductive region.

3. The electron emitter device of claim 2, wherein the enclosed space provided by the enclosure is evacuated to a vacuum.

4. The electron emitter device of claim 1, wherein the transition metal perovskite oxide has the formula $ABO_3$, wherein A is selected from an alkaline earth element, a rare earth element, and combinations thereof and B is selected from a 3d transition metal element, a 4d transition metal element, and combinations thereof.

5. The electron emitter device of claim 4, wherein A is selected from Mg, Ca, Sr, Ba, La, Pr, Sc, Y, and combinations thereof and B is selected from Sc, Ti, V, Cr, Mn, Fe, Co, Ni, Nb, and combinations thereof.

6. The electron emitter device of claim 4, wherein A is selected from Mg, Ca, Sr, Ba, La, Pr, Y and B is selected from Ti, V, Mn, Fe, Nb, and combinations thereof.

7. The electron emitter device of claim 1, wherein the transition metal perovskite oxide has formula $AVO_3$, wherein A is selected from an alkaline earth element, a rare earth element, and combinations thereof.

8. The electron emitter of claim 7, wherein the transition metal perovskite oxide has formula $(A_1)_{1-x}(A_2)_xVO_3$, wherein $A_1$ and $A_2$ are independently selected from an alkaline earth element and a rare earth element, wherein $0 \le x \le 1$.

9. The electron emitter device of claim 8, wherein $A_1$ and $A_2$ are independently selected from Mg, Ca, Sr, Ba, La, Sc, and Y.

10. The electron emitter device of claim 1, wherein the transition metal perovskite oxide is selected from formula $Sr_{1-x}Ba_xVO_3$, formula $La_{1-x}Sr_xMnO_3$, $LaFeO_3$, and $BaNbO_3$, wherein $0 \le x \le 1$.

11. The electron emitter device of claim 1, wherein the transition metal perovskite has formula $Sr_{1-x}Ba_xVO_3$, wherein $0 \le x \le 1$.

12. The electron emitter device of claim 1, wherein the transition metal perovskite oxide exhibits a calculated work function of less than about 2.50 eV.

13. The electron emitter device of claim 1, wherein the mobile conducting electrons exhibit a conductivity of at least $10^{-2}$ $\Omega^{-1}$cm$^{-1}$ at room temperature.

14. The electron emitter device of claim 1, wherein the transition metal perovskite oxide exhibits a measured band gap of no more than about 2 eV.

15. The electron emitter device of claim 1, wherein the transition metal perovskite oxide is characterized by an O 2p-band center and $E_{Fermi}$ and the calculated energy difference $\Delta$ between the O 2p-band center and $E_{Fermi}$ is −3 eV or more.

16. The electron emitter device of claim 1, wherein a sufficient fraction of the surface of the transition metal perovskite oxide has (001) orientation and AO-termination such that the surface exhibits an effective work function which is substantially similar to the work function of a surface which is substantially (001) orientated and substantially AO-terminated.

17. The electron emitter device of claim 1, wherein the cathode is formed entirely of the transition metal perovskite oxide.

18. A source of microwaves or millimeter waves comprising the electron emitter device of claim 1.

19. A thermionic energy converter comprising the electron emitter device of claim 1.

* * * * *